(12) United States Patent
Park et al.

(10) Patent No.: US 9,559,103 B2
(45) Date of Patent: Jan. 31, 2017

(54) MEMORY DEVICE INCLUDING SELECTIVELY DISPOSED LANDING PADS EXPANDED OVER SIGNAL LINE

(71) Applicant: SAMSUNG ELECTRONICS CO., LTD., Suwon-si, Gyeonggi-Do (KR)

(72) Inventors: Je-Min Park, Suwon-Si (KR); Tae-Jin Park, Yongin-Si (KR); Yong-Kwan Kim, Yongin-Si (KR); Yoo-Sang Hwang, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/716,594

(22) Filed: May 19, 2015

(65) Prior Publication Data

US 2016/0064384 A1   Mar. 3, 2016

(30) Foreign Application Priority Data

Aug. 26, 2014   (KR) .................. 10-2014-0111708

(51) Int. Cl.
*H01L 27/108*   (2006.01)

(52) U.S. Cl.
CPC ... *H01L 27/10814* (2013.01); *H01L 27/10855* (2013.01); *H01L 27/10885* (2013.01); *H01L 27/10894* (2013.01)

(58) Field of Classification Search
USPC ........................................................ 257/368
See application file for complete search history.

(56) References Cited

U.S. PATENT DOCUMENTS

| | | |
|---|---|---|
| 6,404,002 B2 | 6/2002 | Hahn |
| 7,582,925 B2 | 9/2009 | Jung et al. |
| 8,129,239 B2 | 3/2012 | Jung |
| 2004/0127050 A1* | 7/2004 | Park .................. H01L 21/76895 438/692 |

FOREIGN PATENT DOCUMENTS

| | | |
|---|---|---|
| KR | 10-2005-0106579 A | 11/2005 |
| KR | 10-0745069 | 7/2007 |

* cited by examiner

*Primary Examiner* — Hrayr A Sayadian
(74) *Attorney, Agent, or Firm* — Volentine & Whitt, PLLC

(57) ABSTRACT

Provided is a memory device. The memory device includes a substrate including a cell area and a peripheral area; gate line stacks and bit line stacks configured to vertically cross in the cell area; buried contacts disposed in areas, which are simultaneously shared by neighboring gate line stacks and neighboring bit line stacks; expanded landing pads including expanded portions connected to the buried contacts and expanded over adjacent bit line stacks, and disposed in a row; landing pads spaced apart from the expanded landing pads as a column, connected to the buried contacts, and having horizontal widths smaller than those of the expanded landing pads; and first storage nodes connected to the expanded portions of the expanded landing pads, and second storage nodes connected to the landing pads.

20 Claims, 37 Drawing Sheets

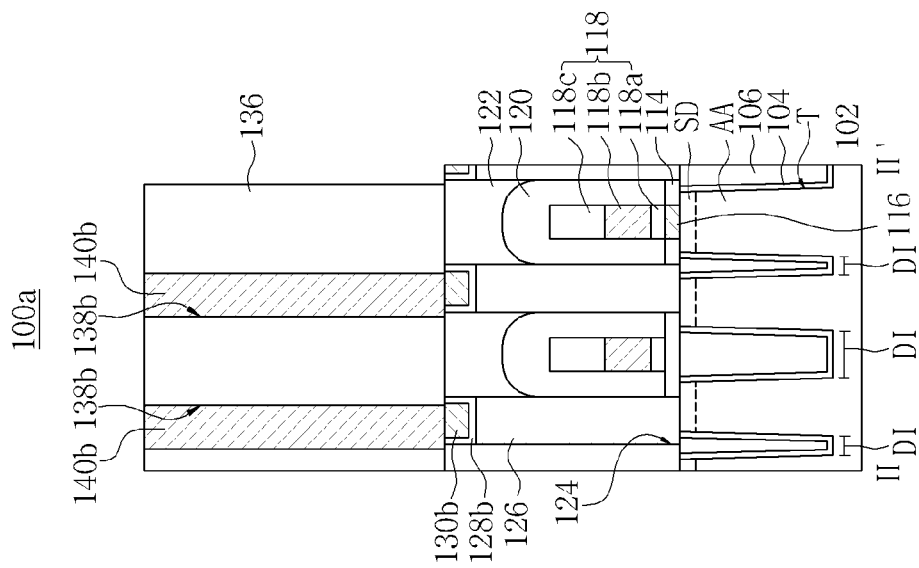
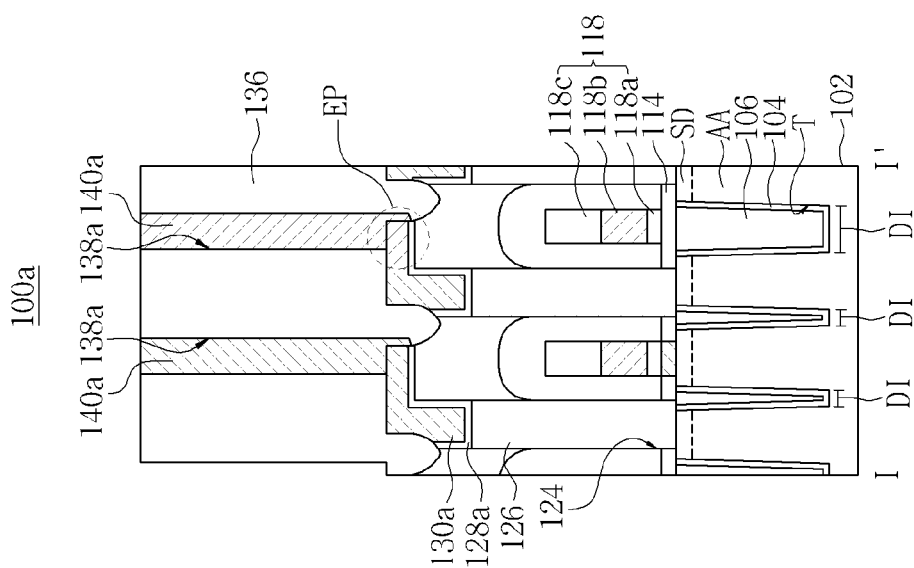

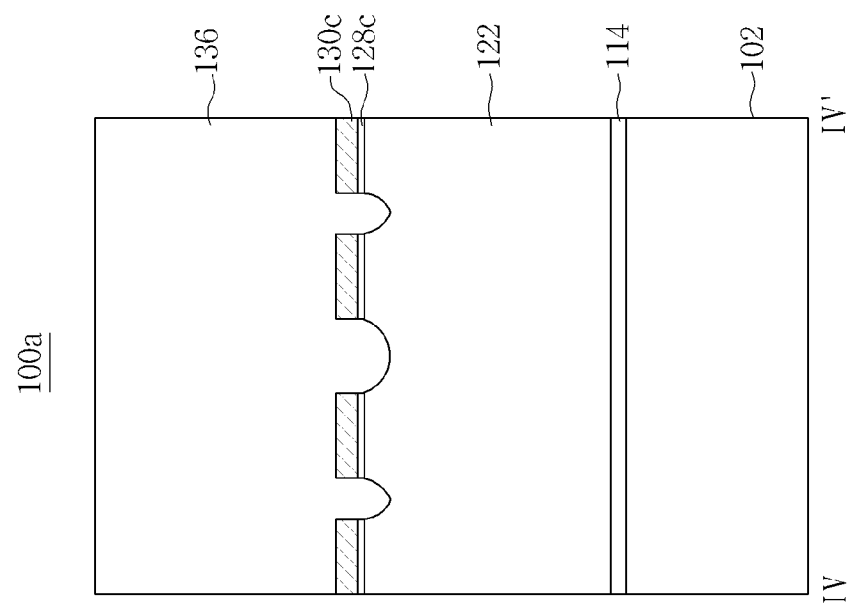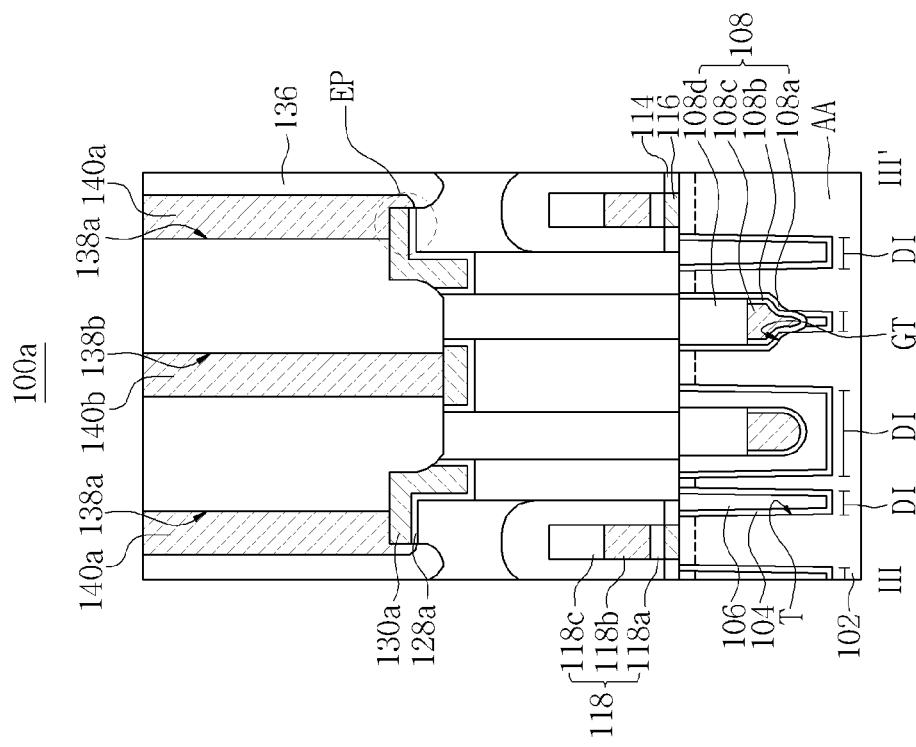

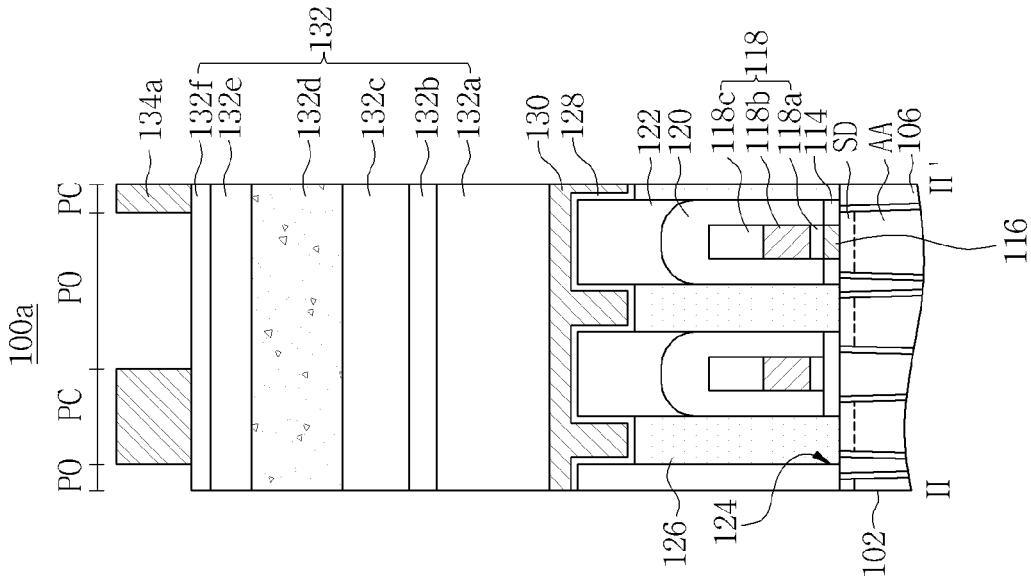
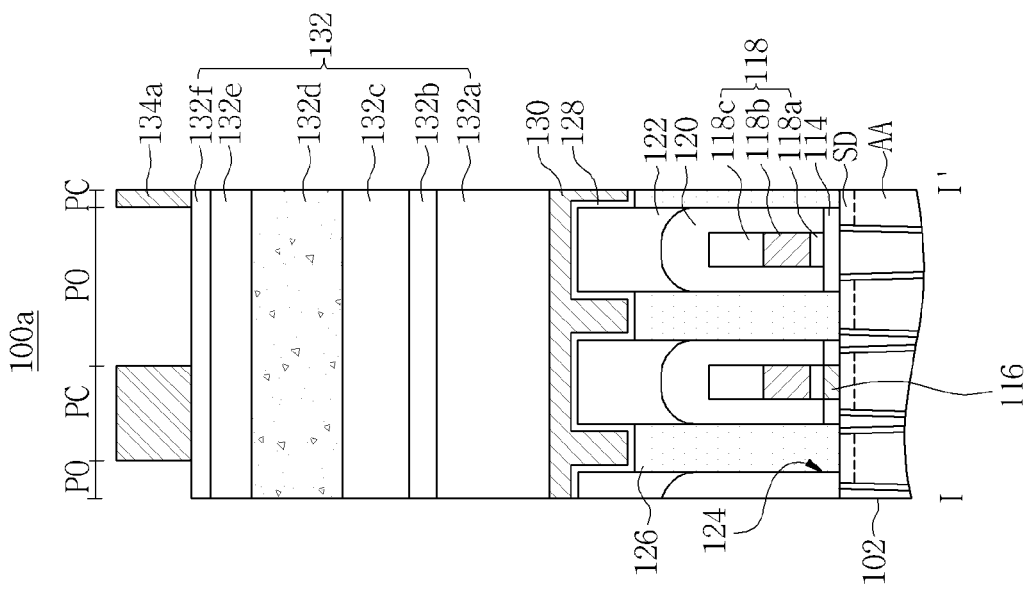

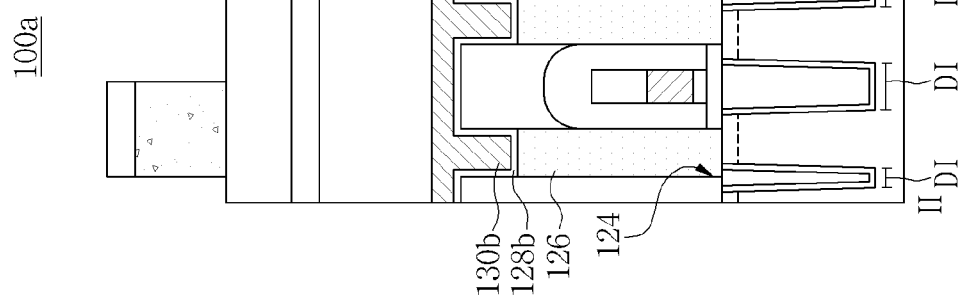
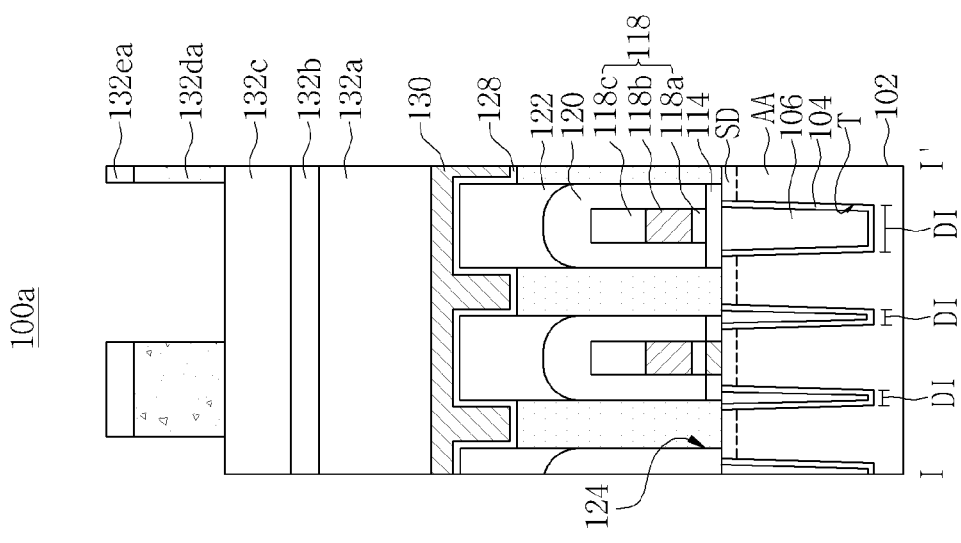

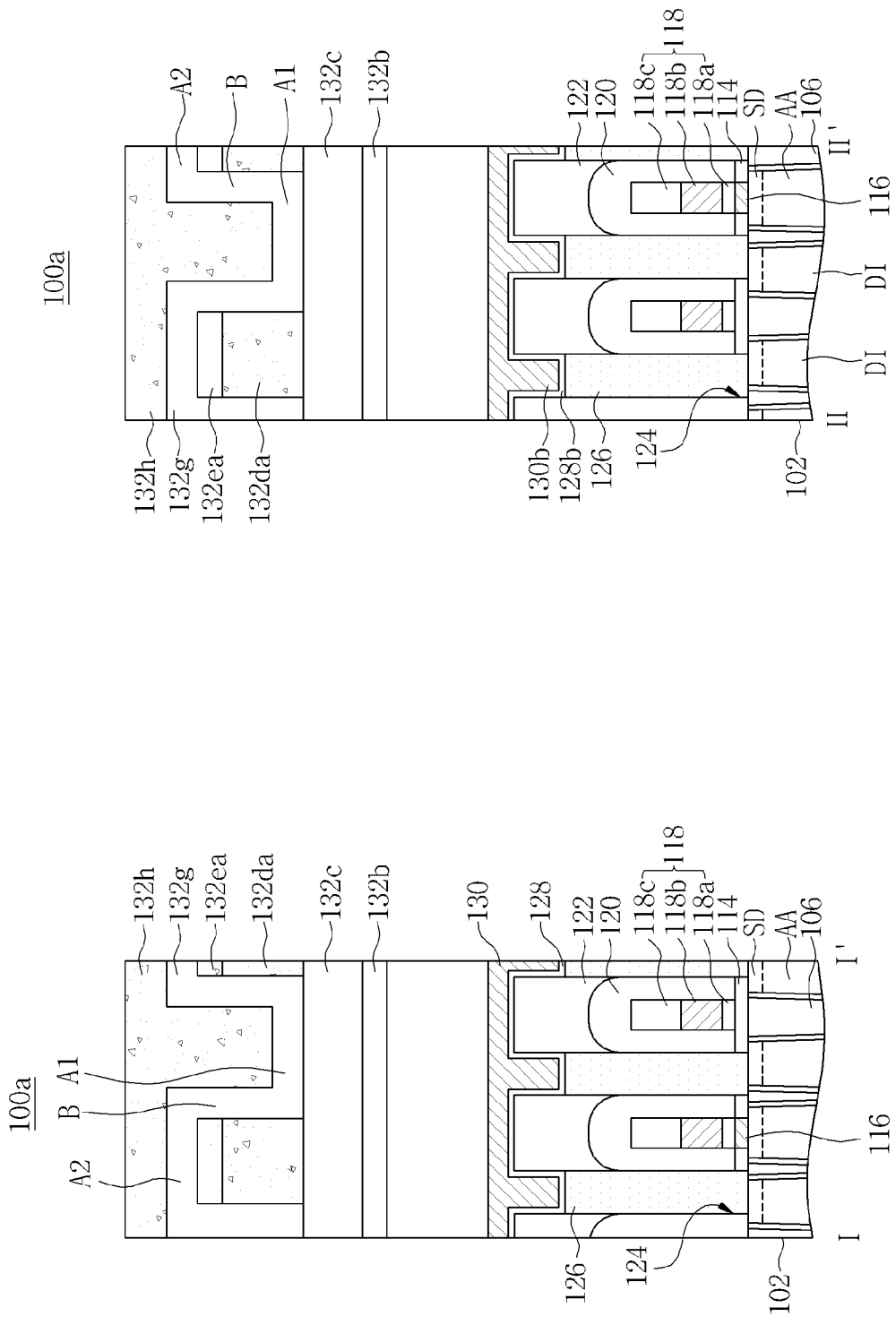

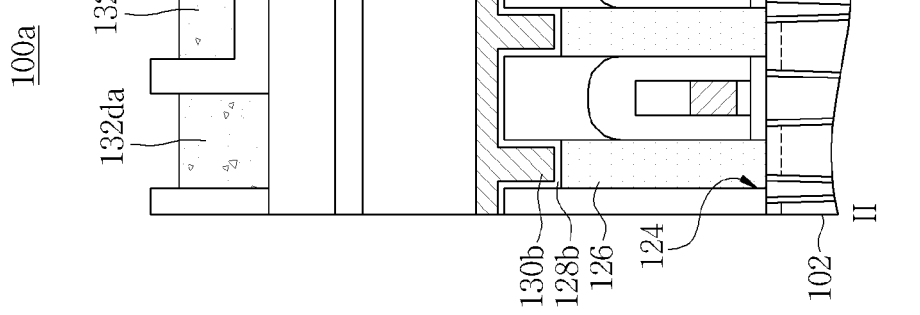
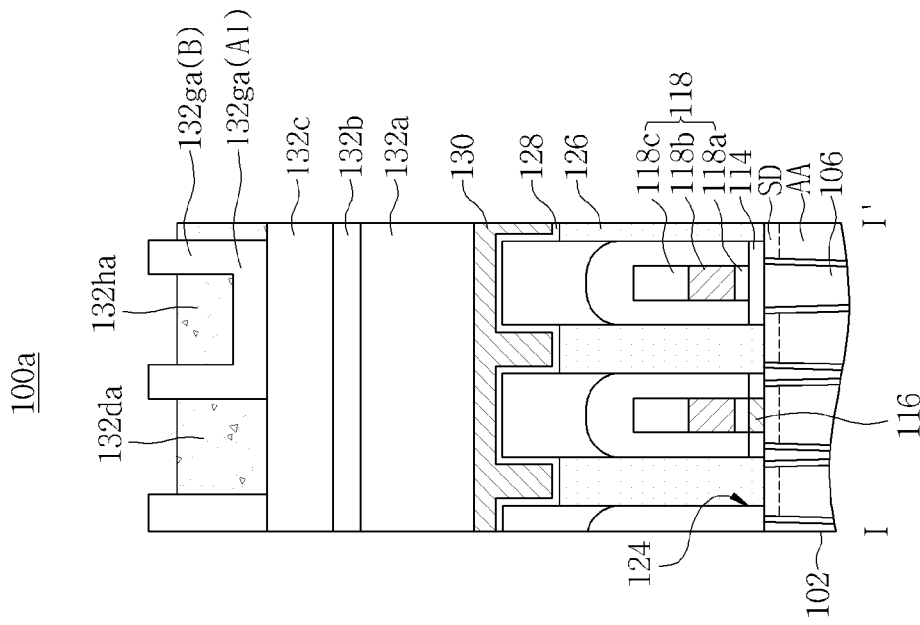

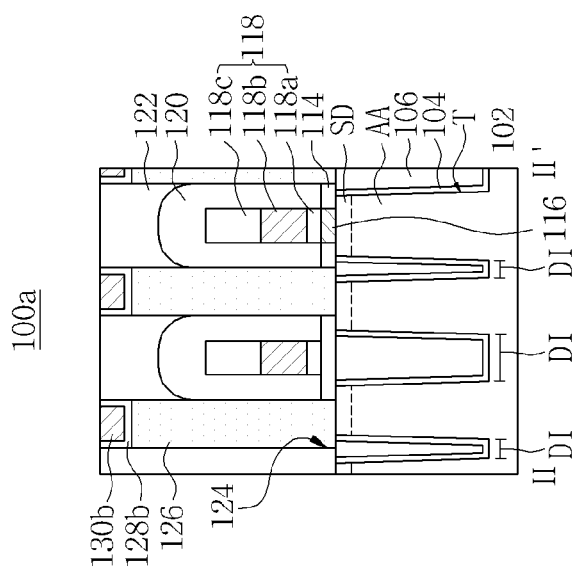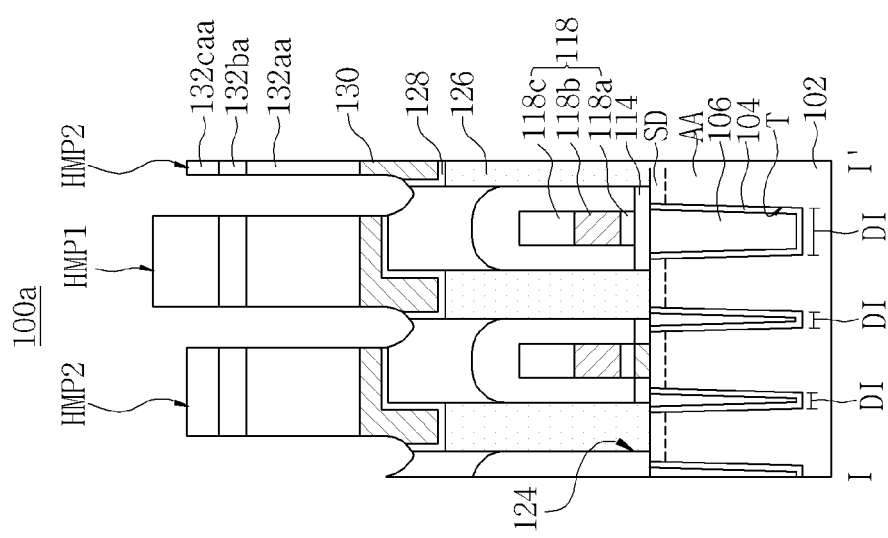

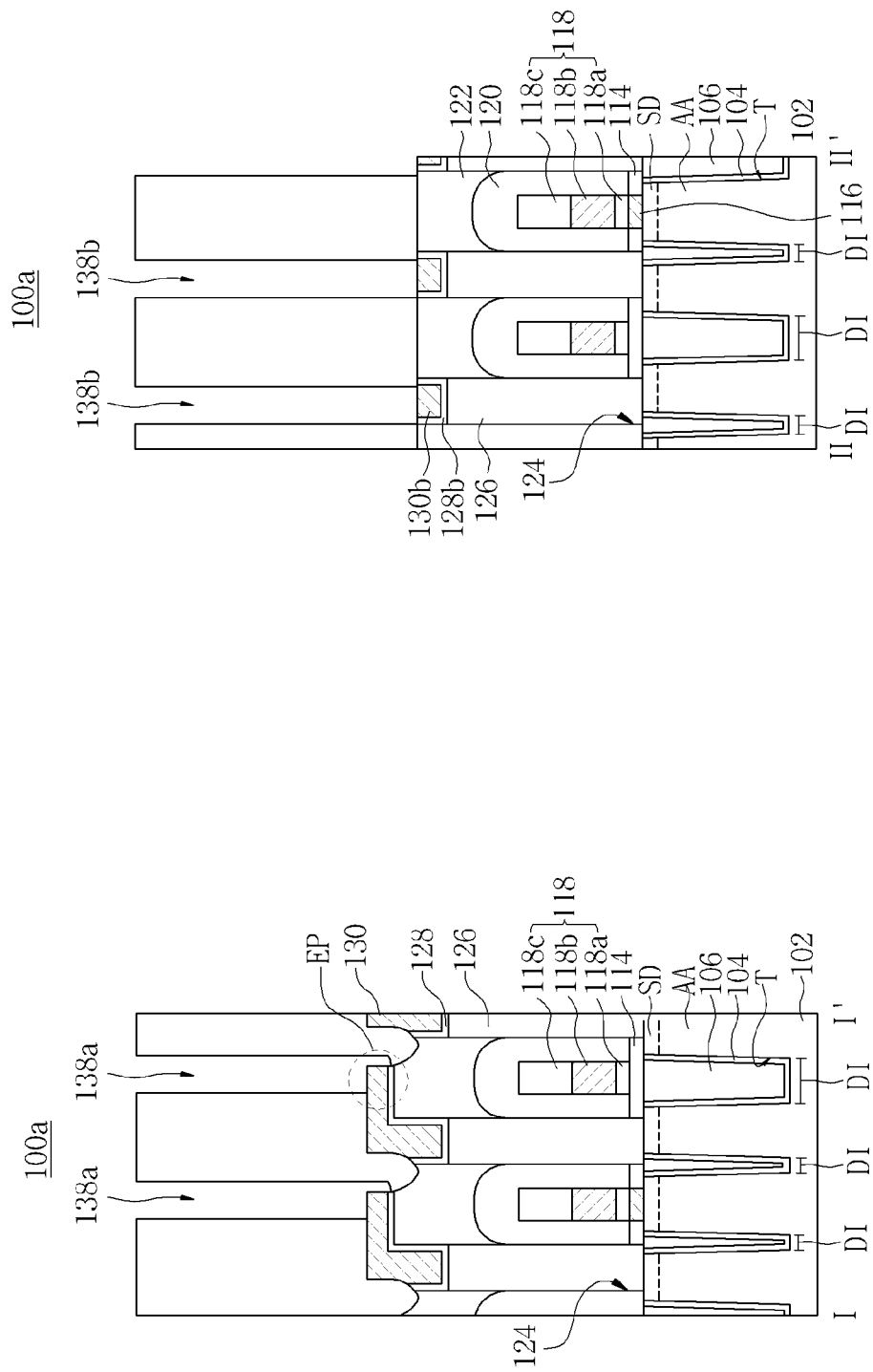

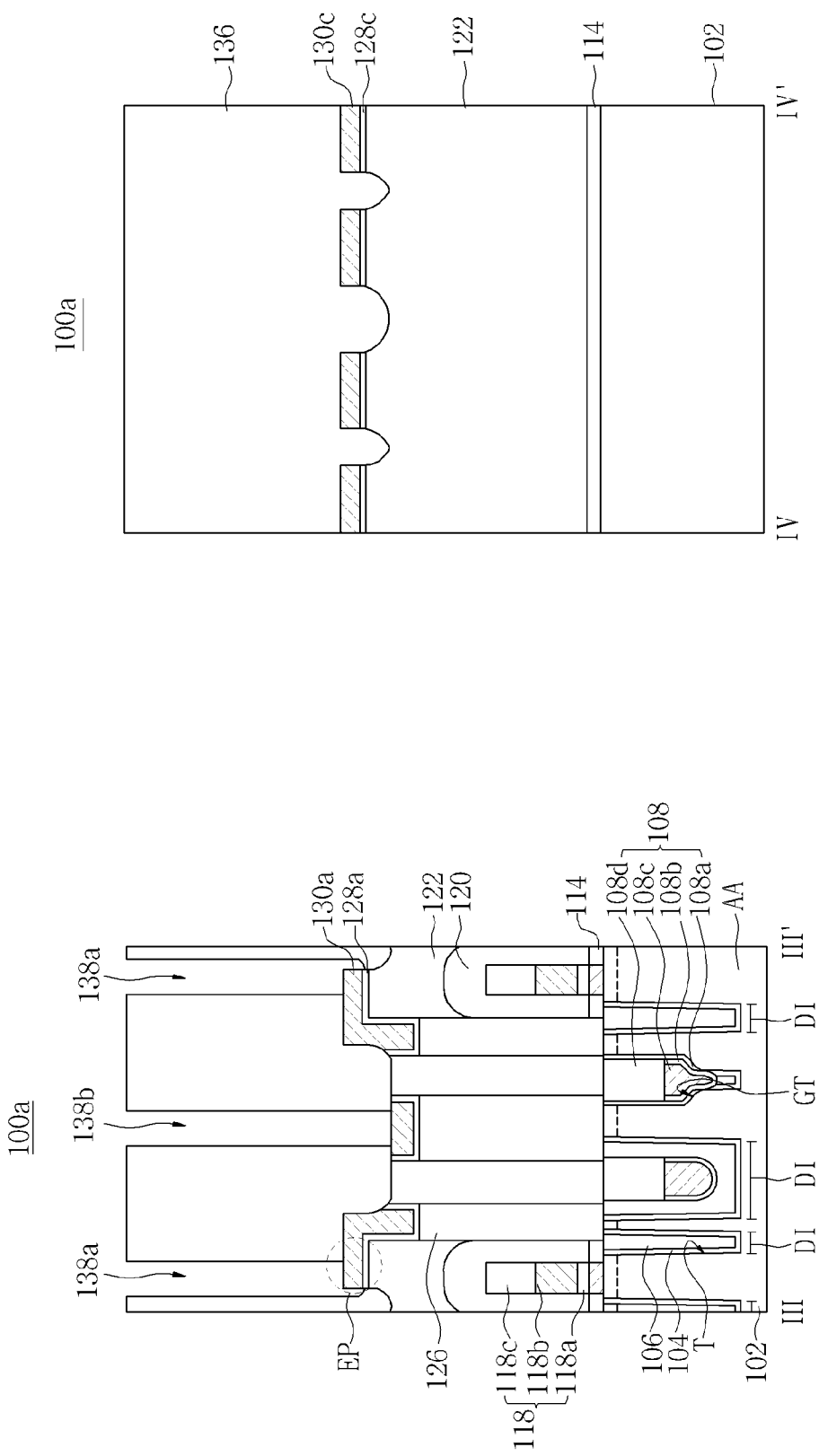

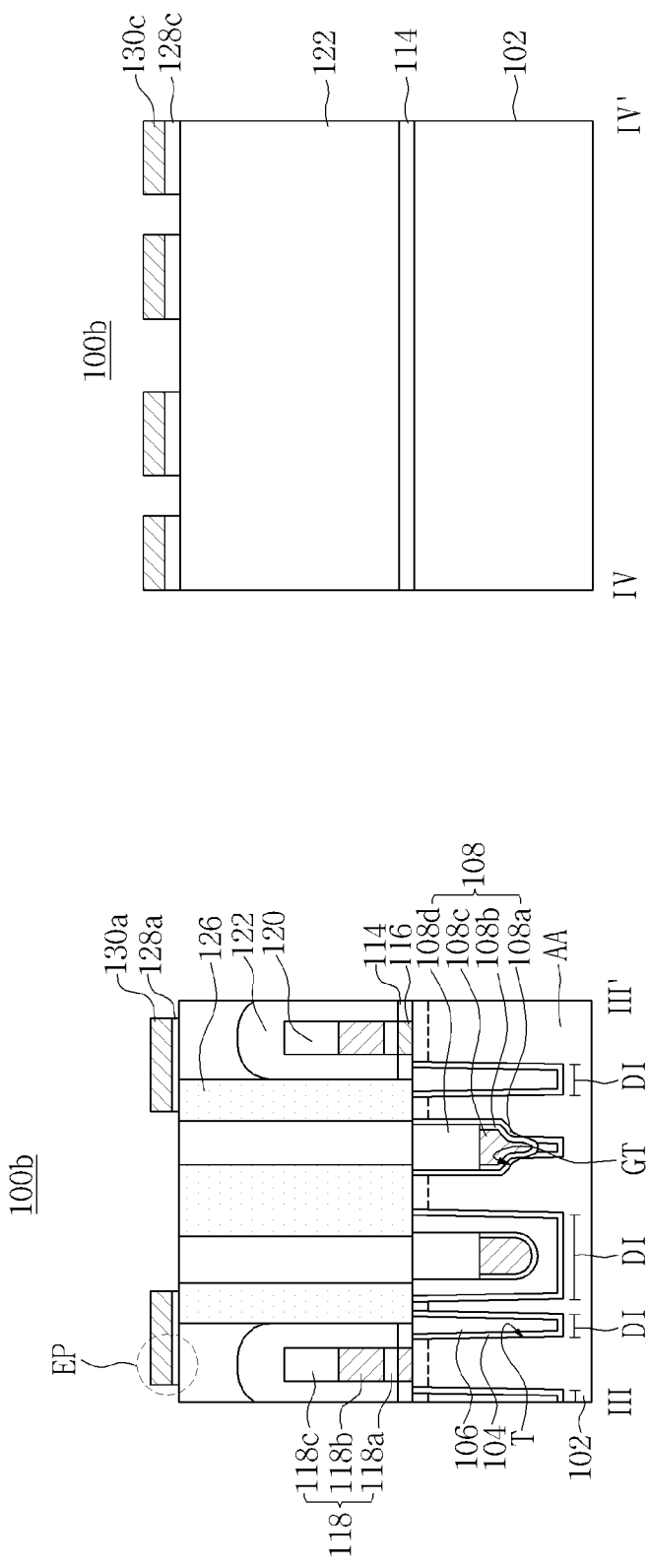

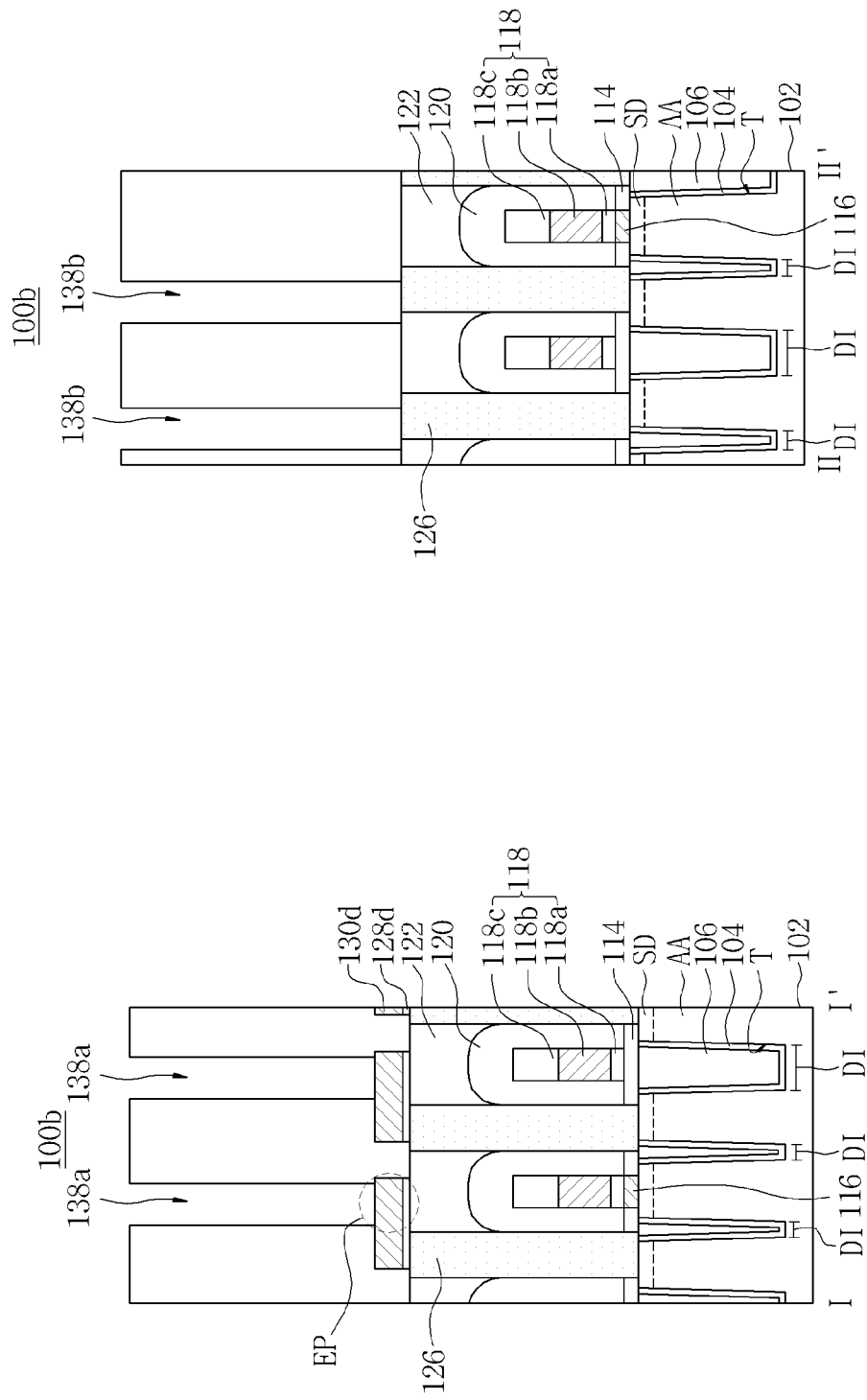

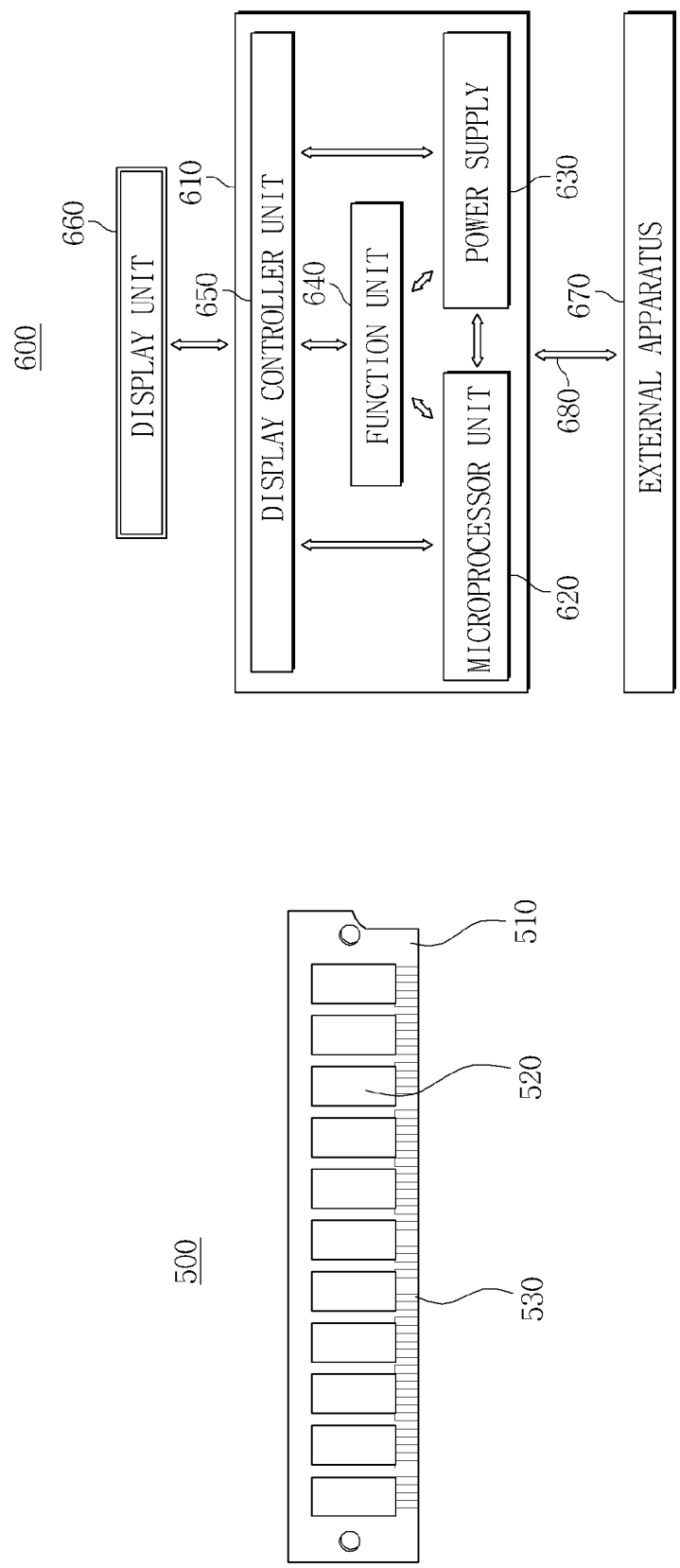

MEMORY DEVICE INCLUDING SELECTIVELY DISPOSED LANDING PADS EXPANDED OVER SIGNAL LINE

PRIORITY STATEMENT

This application claims priority under 35 U.S.C. §119 to Korean Patent Application No. 10-2014-0111708 filed on Aug. 26, 2014, the disclosure of which is hereby incorporated by reference in its entirety.

BACKGROUND

The inventive concept relates to memory devices. More particularly, the inventive concept relates to a memory device including buried contacts electrically connected to source/drain regions, and nodes disposed on and electrically connected to the buried contacts.

As the degree of integration of semiconductor memory devices having memory cells, such as DRAMs, increase, certain patterns that must be provided on the memory cells become more densely arranged and more minute. Examples of these patterns are conductive lands or pads electrically connected to the memory cells and storage nodes disposed on the pads. That is, the process margin needed to form pads and storage nodes, which are disposed in a cell area, is significantly decreasing.

SUMMARY

In accordance with an aspect of the inventive concept, there is provided a memory device including a substrate spanning a cell area and a peripheral area of the device, gate line stacks in the cell area, bit line stacks crossing the gate line stacks in the cell area, first and second groups of buried contacts, rows of expanded first landing pads, second landing pads, first storage nodes, and second storage nodes and in which each of the buried contacts is disposed in a respective area bounded by neighboring ones of the gate line stacks and neighboring ones of the bit line stacks in a plan view of the device, the expanded first landing pads including expanded portions respectively electrically connected to the buried contacts of the first group and extending over respective ones of the bit line stacks that are adjacent to the buried contacts of the first group, the second landing pads are disposed in columns with the expanded landing pads as spaced apart from the expanded first landing pads, the second landing pads are respectively electrically connected to the buried contacts of the second group, the second landing pads are narrower than the expanded landing pads in a given horizontal direction parallel to an upper surface of the substrate, the first storage nodes are electrically connected to the expanded first landing pads at the expanded portions thereof, and the second storage nodes are electrically connected to the second landing pads.

In accordance with another aspect of the inventive concept, there is provided a memory device including a substrate, gate line stacks, bit line stacks crossing the gate line stacks, first and second groups of buried contacts, expanded landing pads, first storage nodes and second storage nodes, and in which each of the buried contacts are disposed in a respective area bounded by neighboring ones of the gate line stacks and neighboring ones of the bit line stacks in a plan view of the device, the expanded landing pads are disposed in rows and columns, the expanded landing pads are respectively electrically connected to the buried contacts of the first group, the expanded landing pads are include expanded portions extending over respective ones of the bit line stacks adjacent the buried contacts of the first group, the first storage nodes are electrically connected to the expanded landing pads at the expanded portions thereof, and the second storage nodes are electrically connected to the buried contacts of the second group.

In accordance with still another aspect of the inventive concept, there is provided a memory device having a cell area and including a substrate spanning the cell area of the device, gate line stacks in the cell area, bit line stacks in the cell area and crossing the gate line stacks, an interlayer insulating layer disposed on the substrate, first and second groups of buried contacts, rows of first conductive pad contacts, first storage nodes, and second storage nodes, and in which the buried contacts of the first group are arrayed in first rows, the buried contacts of the second group are arrayed in a second row, the second row of buried contacts are interposed between the first row of buried contacts, each of the buried contacts is buried in the interlayer insulating layer within a respective area bounded in a plan view of the device by neighboring ones of the gate line stacks and neighboring ones of the bit line stacks, the first conductive pad contacts are respectively electrically connected to the buried contacts of the first group, each of the first conductive pad contacts has a first portion extending directly over the buried contact to which it is electrically connected, and each of the first conductive pad contacts has an extension extending from the first portion on an upper surface of the interlayer insulating layer to a location over a respective one of the bit line stacks that is adjacent to said buried contact, the first storage nodes are electrically connected to the first conductive pad contacts at the extensions thereof so as to be respectively electrically connected to the buried contacts of the first group via the first conductive pad contacts, and the second storage nodes are respectively electrically connected to the buried contacts of the second group.

BRIEF DESCRIPTION OF THE DRAWINGS

The foregoing and other features and advantages of the inventive concept will be more apparent from the detailed description of preferred embodiments of the inventive concepts, as illustrated in the accompanying drawings in which like reference characters designate the same parts throughout the different views. The drawings are not necessarily to scale, emphasis instead being placed upon illustrating the principles of the inventive concept. In the drawings:

FIGS. 2A to 2D schematically illustrate the first embodiment of a memory device in accordance with the inventive concept, with FIGS. 2A, 2B and 2C being longitudinal cross-sectional views taken along lines I-I', and in FIG. 1A, respectively, and FIG. 2D being a longitudinal sectional view taken along line IV-IV' in FIG. 1C;

FIGS. 4A to 15A, 4B to 15B, 4C to 15C, and 4D to 15D illustrate an embodiment of a method of manufacturing a memory device in accordance with the inventive concept, with FIGS. 4A, 5A, 6A, 7A, 8A, 9A, 10A, 11A, 12A, 13A, 14A and 15A being longitudinal cross-sectional views taken in directions corresponding to the direction of line I-I' in FIG. 1A, FIGS. 4B, 5B, 6B, 7B, 8B, 9B, 10B, 11B, 12B, 13B, 14B and 15B being longitudinal cross-sectional views taken in directions corresponding to the directions of line II-II' in FIG. 1A, FIGS. 4C 5C, 6C, 7C, 8C, 9C, 10C, 11C, 12C, 13C, 14C and 15C being longitudinal cross-sectional views taken in directions corresponding to the direction of line III-III' in FIG. 1A, and FIGS. 4D, 5D, 6D, 7D, 8D, 9D, 10D, 11D, 12D, 13D, 14D and 15D being longitudinal cross-sectional views taken in directions corresponding to the directions of line IV-IV' in FIG. 1C;

FIGS. 16A to 18A, 16B to 18B, 16C to 18C, and 16D to 18D are views illustrating another embodiment of a method of manufacturing the memory device in accordance with the inventive concept, with FIGS. 16A, 17A and 18A being longitudinal cross-sectional views taken in directions corresponding to the direction of line I-I' shown in FIG. 1A, FIGS. 16B, 17B and 18B being longitudinal cross-sectional views taken in directions corresponding to the direction of line II-II' in FIG. 1A, FIGS. 16C, 17C and 18C being longitudinal cross-sectional views taken in directions corresponding to the direction of line III-III' in FIG. 1A, and FIGS. 16D, 17D 18D being longitudinal cross-sectional views taken in directions corresponding to the direction of line IV-IV' shown in FIG. 1C;

FIG. 19 is a conceptual view illustrating a module in accordance with an embodiment of the inventive concept, which includes the memory device in accordance with the embodiment of the inventive concept;

FIG. 20 is a conceptual block diagram illustrating an electronic system in accordance with an embodiment of the inventive concept, which includes the memory device manufactured in accordance with the embodiment of the inventive concept.

DETAILED DESCRIPTION OF THE PREFERRED EMBODIMENTS

Figure 1C:
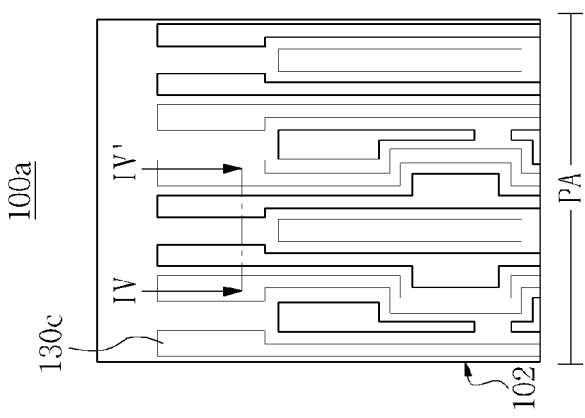
FIG. 1C is a plan view schematically illustrating a peripheral area of the embodiments.

Exemplary embodiments of the present invention will now be described more fully with reference to the accompanying drawings to clarify aspects, features, and advantages of the present invention. The invention may, however, be embodied in many different forms and should not be construed as being limited to the embodiments set forth herein. Rather, these embodiments are provided so that this disclosure will be through and complete, and will fully convey the concept of the invention to those of ordinary skill in the art. The present invention is defined by the appended claims.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. Similarly, although reference may be made to plural features, that reference may apply to a particular sectional view only. For example, what may appear as a plurality of trenches in a sectional view may actually be a single trench. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. Thus, for example, describing an element as comprising a material A, B . . . or N, means that the element may include at least one material selected from the group of materials A, B . . . N.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numerals refer to like elements throughout. Herein, the term "and/or" includes any and all combinations of one or more referents.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms apply to the views (e.g., to a plan view) provided by the figure being described but are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly. The term "over" will mean above in a straight line but not necessarily directly on.

The exemplary embodiments of the invention will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of the invention are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the invention.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

Terms such as "front side" and "back side" may be used in a relative sense herein to facilitate easy understanding of the inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side" and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side. The term "adjacent" may be intended to mean closest to.

The term "extending" will generally reference the lengthwise direction, i.e., the greatest dimension, of an element or feature, especially one having a line-shaped form, as the context and drawings will make clear.

An embodiment of a memory device 100a in accordance with the inventive concept will now be described with reference to FIGS. 1A to 1C and 2A to 2D.

Figure 1B:
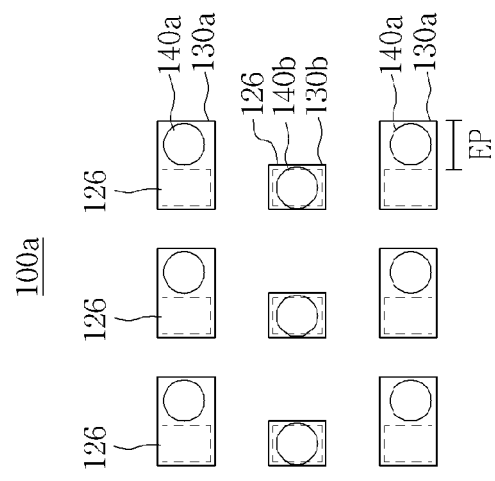
FIGS. 1A and 1B are plan views schematically illustrating a cell area of a first embodiment of a memory device in accordance with the inventive concept.
Figure 1A:
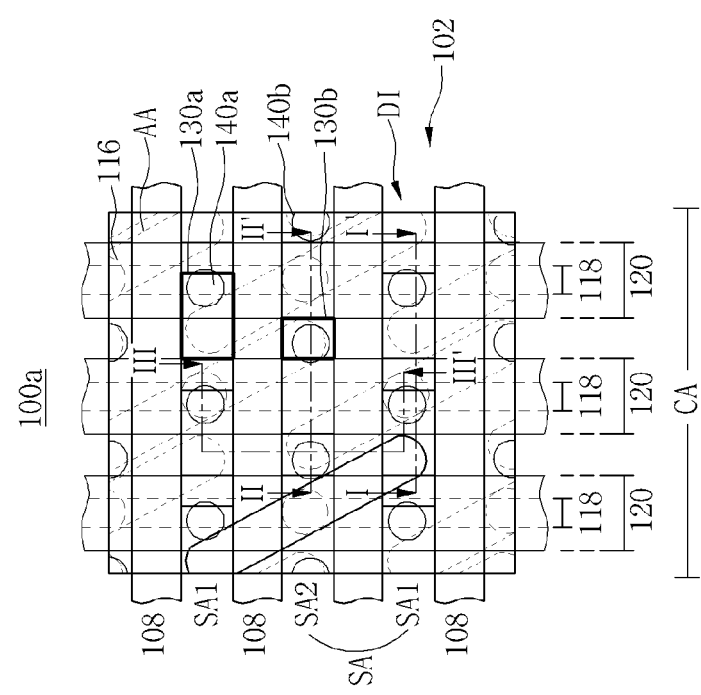
Figure 3A:
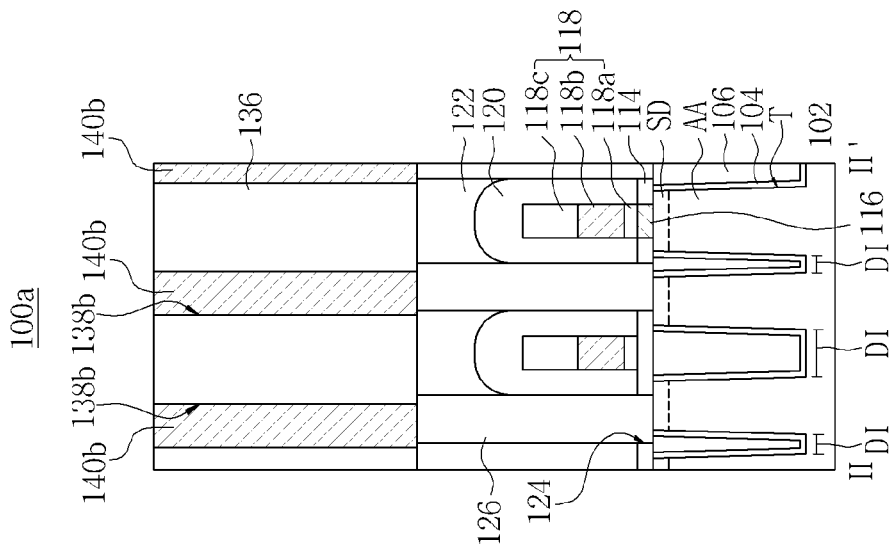
FIGS. 3A to 3D schematically illustrate another embodiment of a memory device in accordance with the inventive concept, with FIGS. 3A, 3B and 3C being longitudinal sectional views taken in directions corresponding to the directions of lines I-I', and III-III' in FIG. 1A, respectively, and FIG. 3D being a longitudinal sectional view taken in a direction corresponding to the direction of line IV-IV' in FIG. 1C.
Figure 3B:
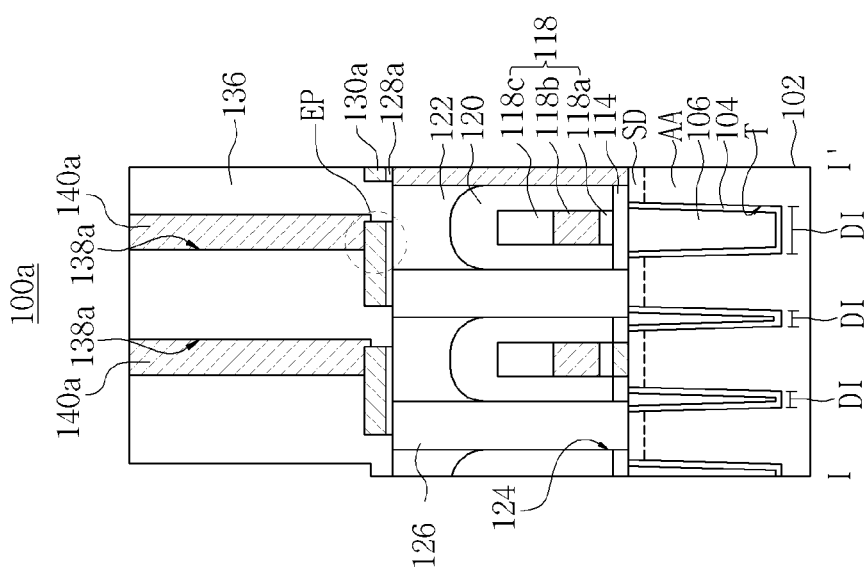
Figure 3D:
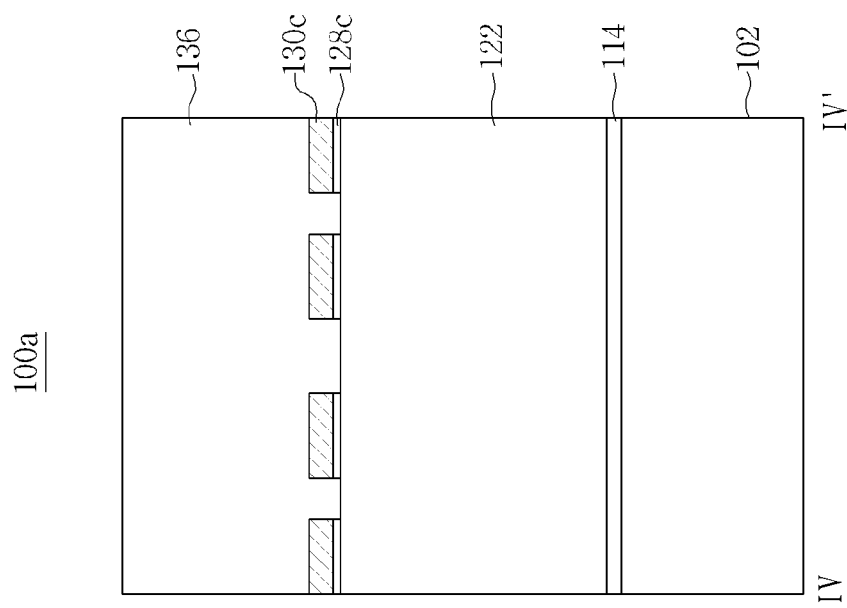
Figure 3C:
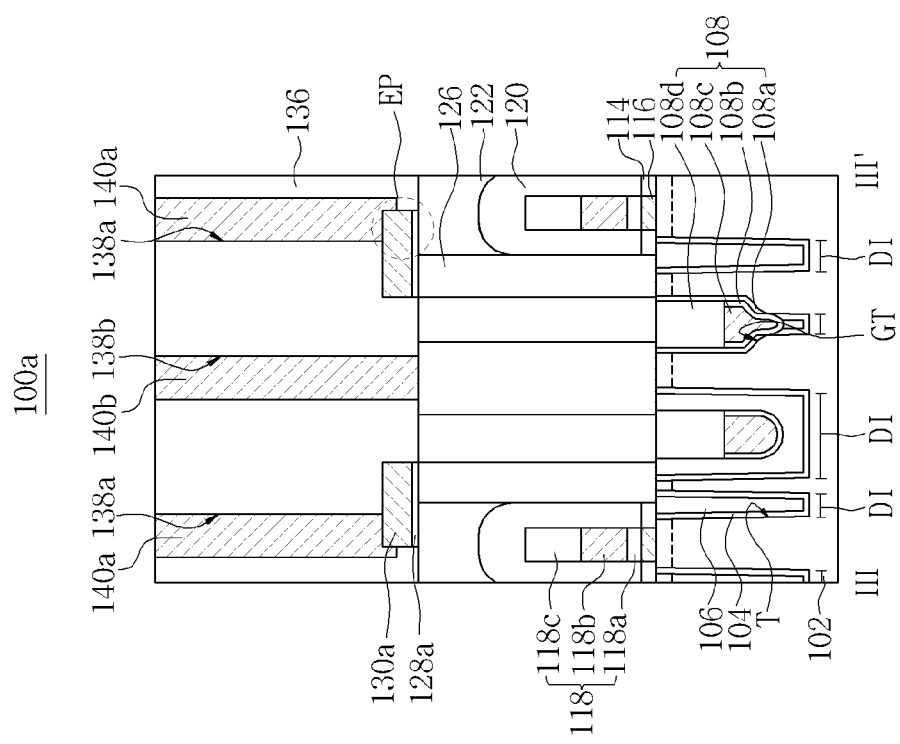
Figure 4A:
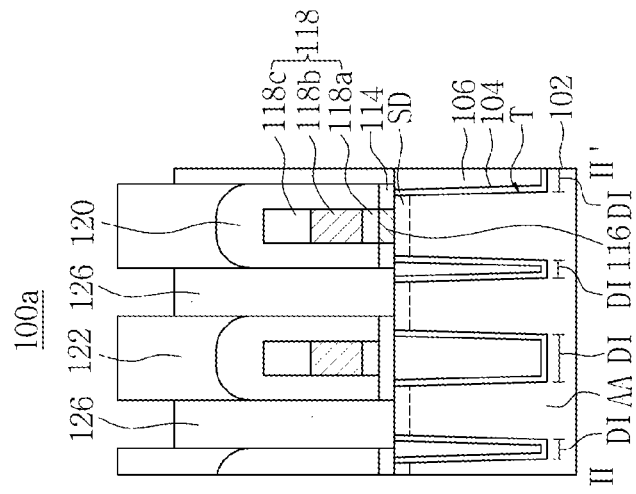
Figure 4B:
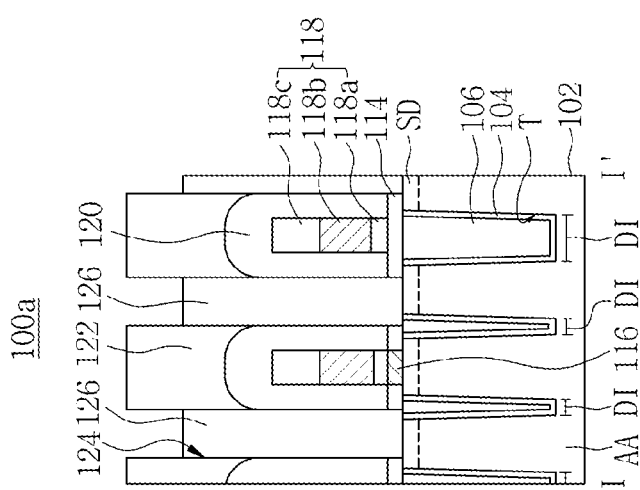
Figure 4D:
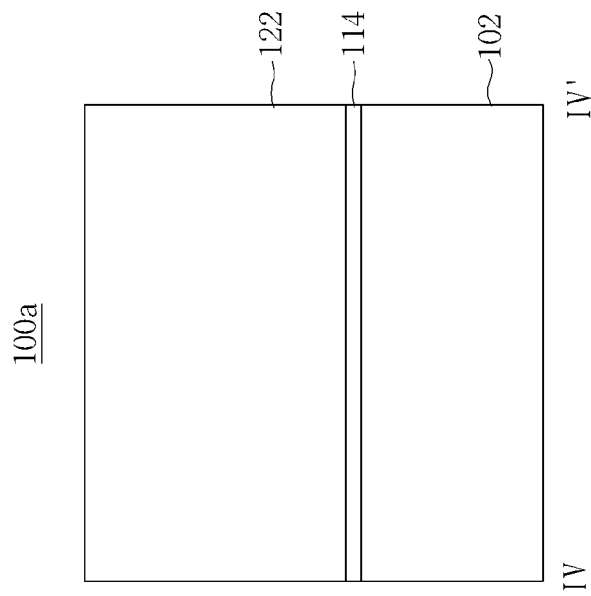
Figure 4C:
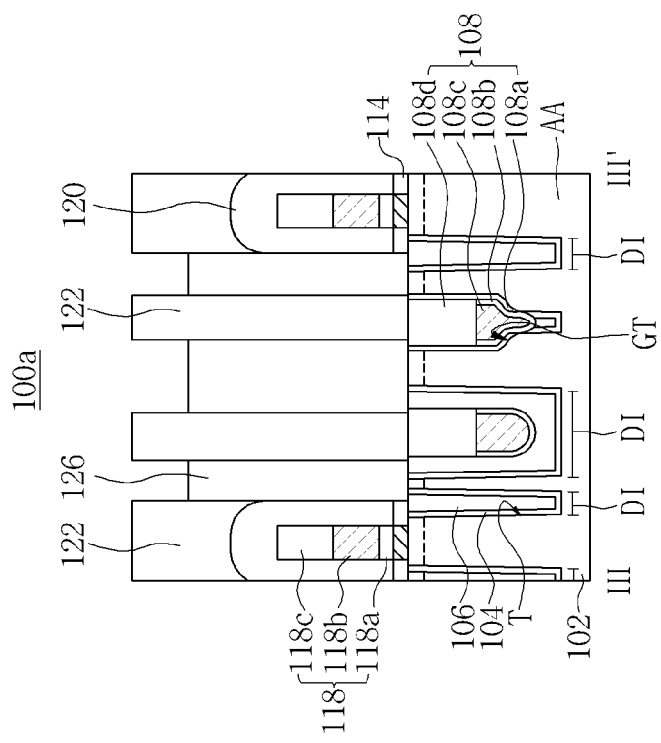
Figure 5D:
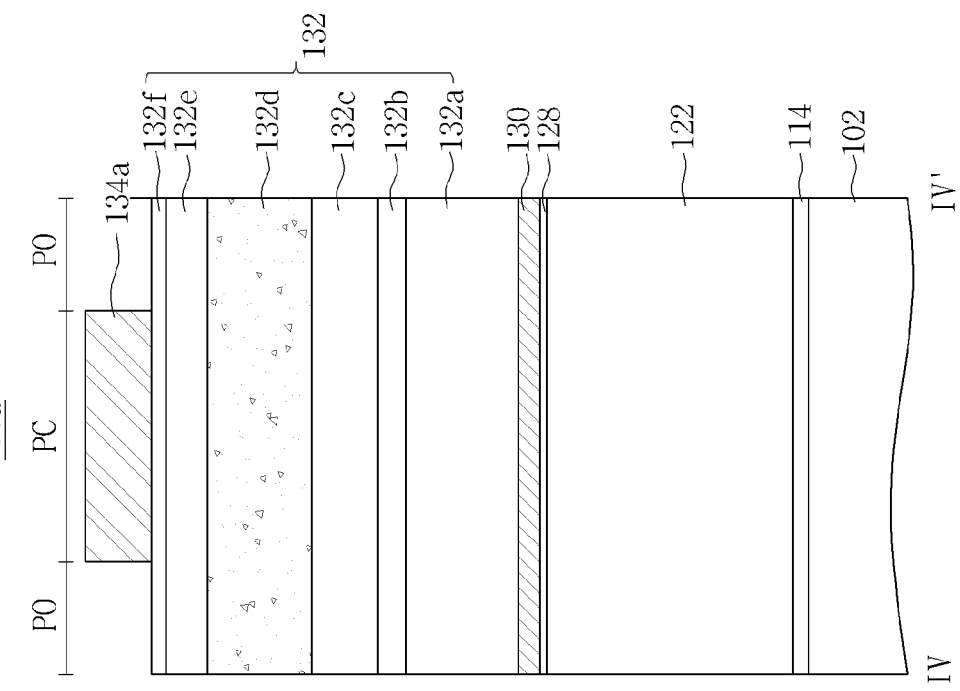
Figure 5C:
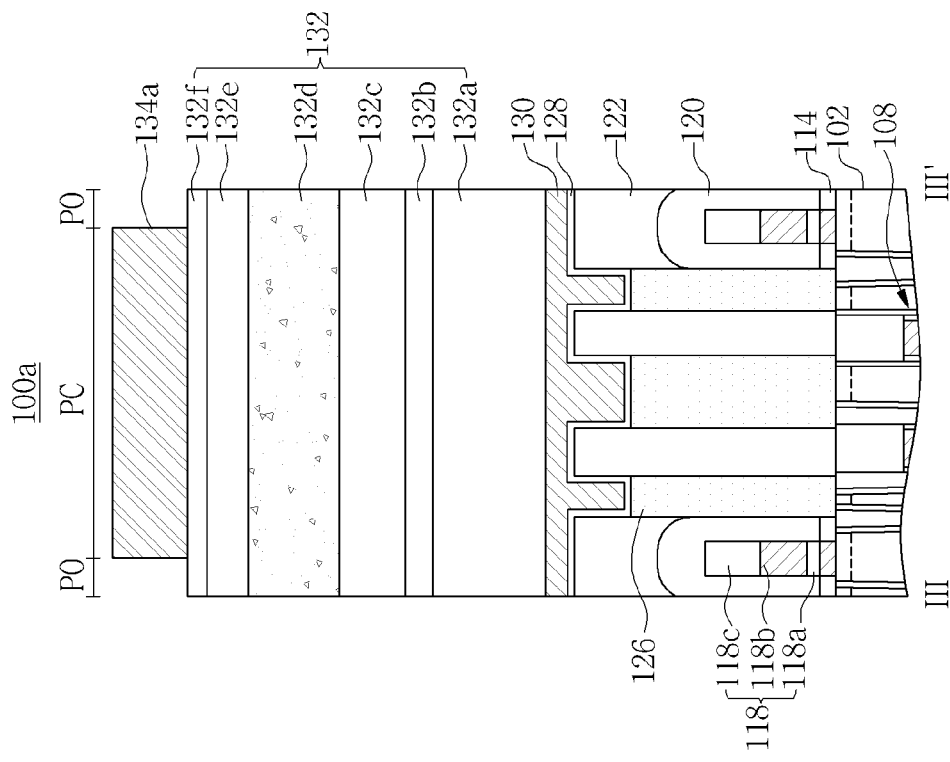
Figure 6D:
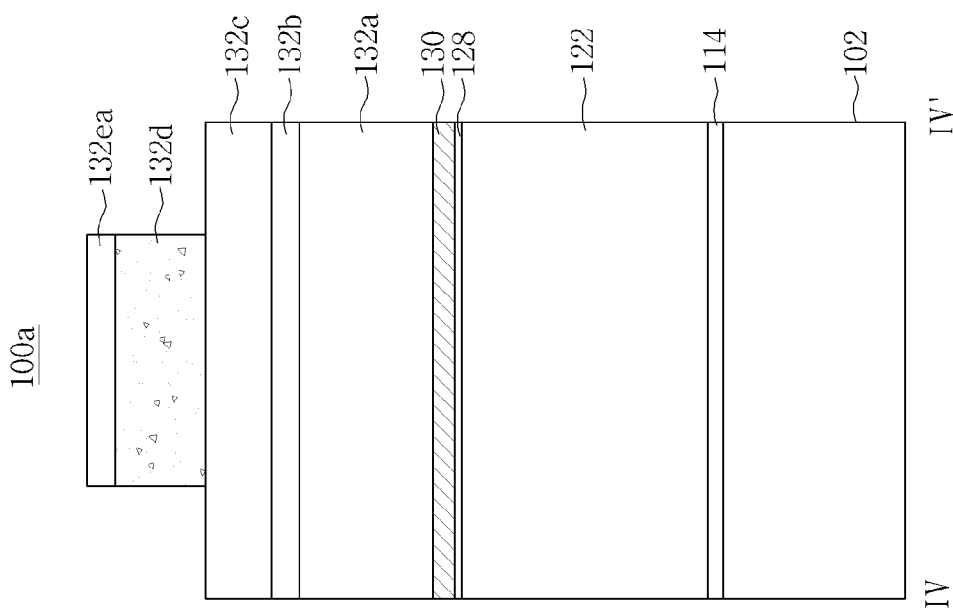
Figure 6C:
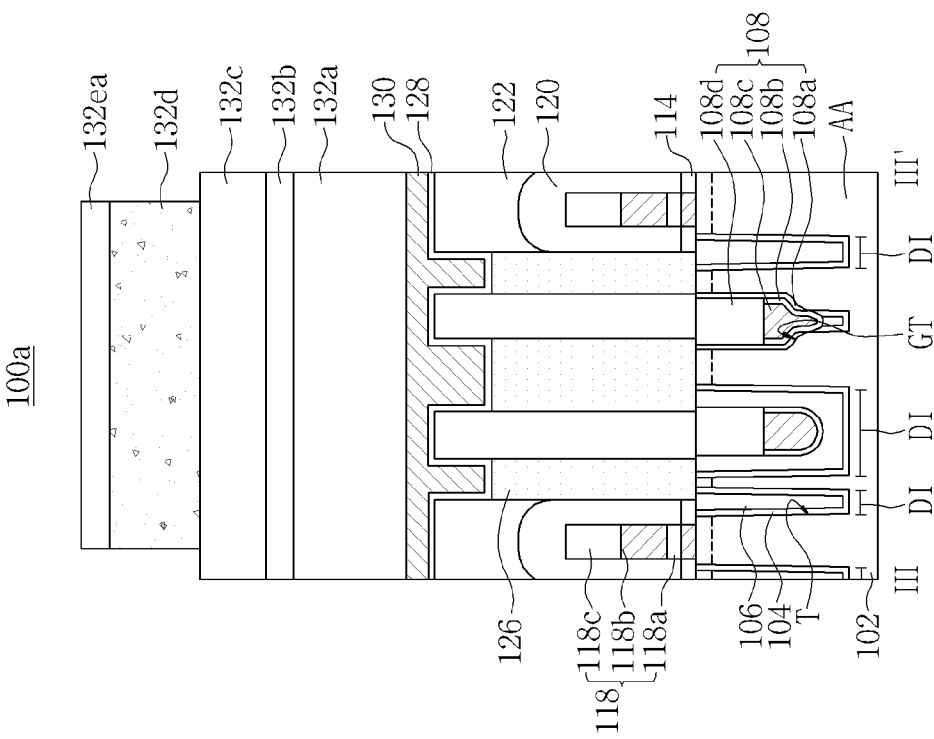
Figure 7D:
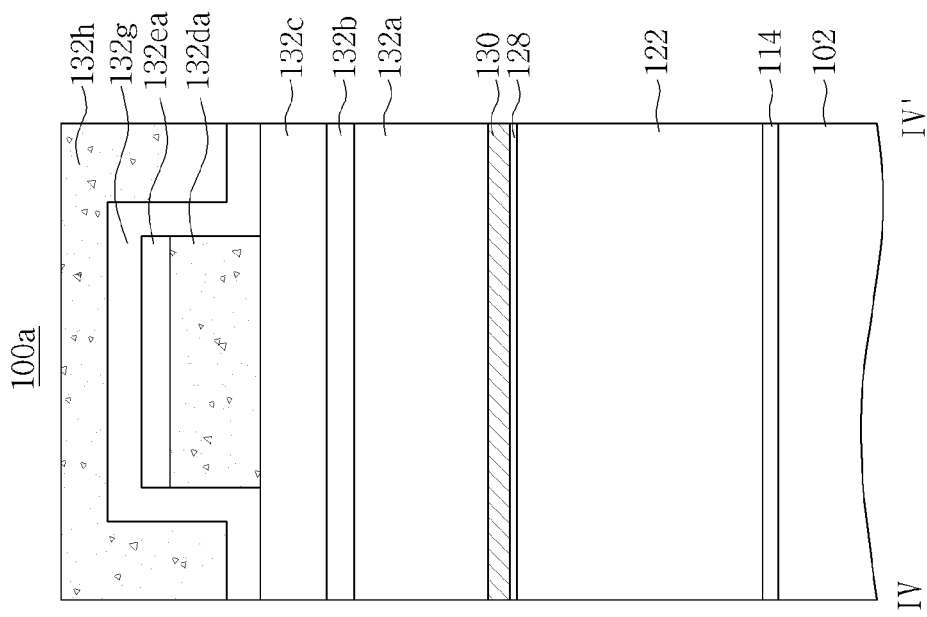
Figure 7C:
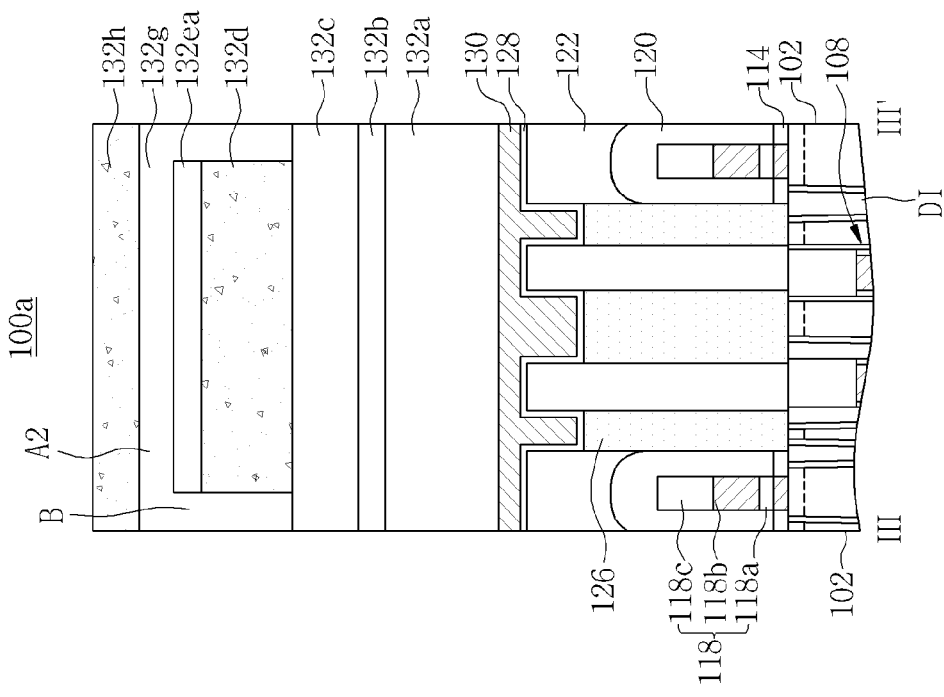
Figure 8D:
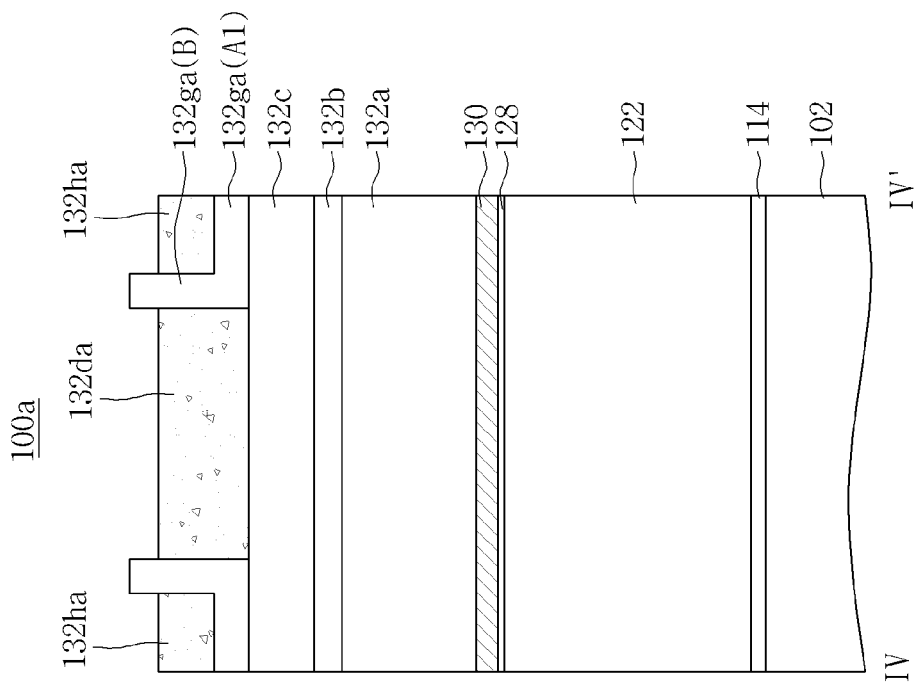
Figure 8C:
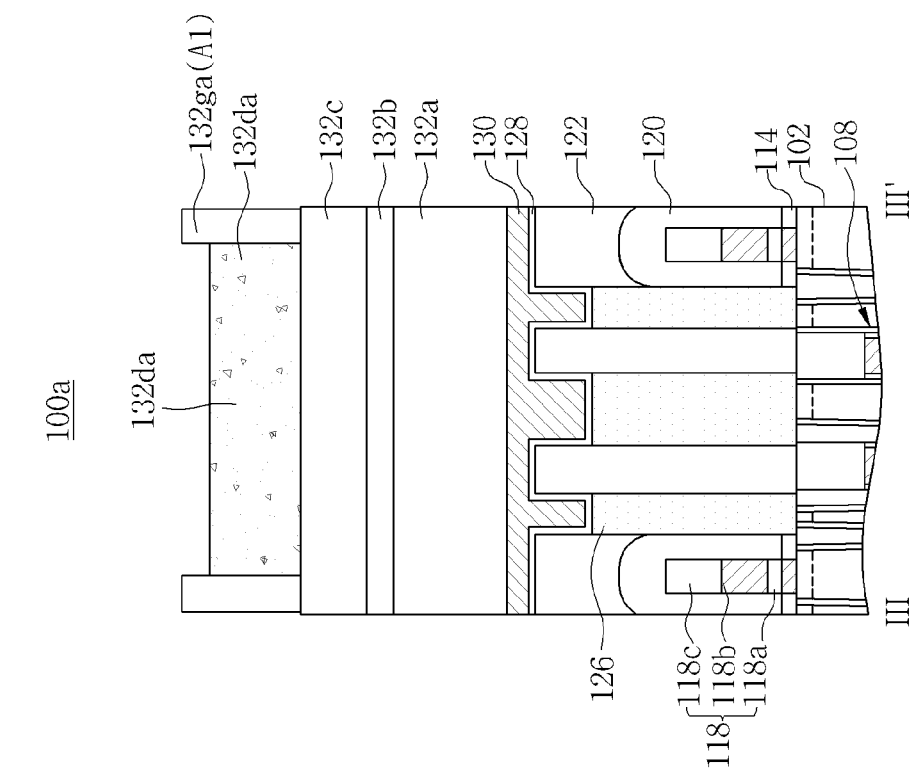
Figure 9A:
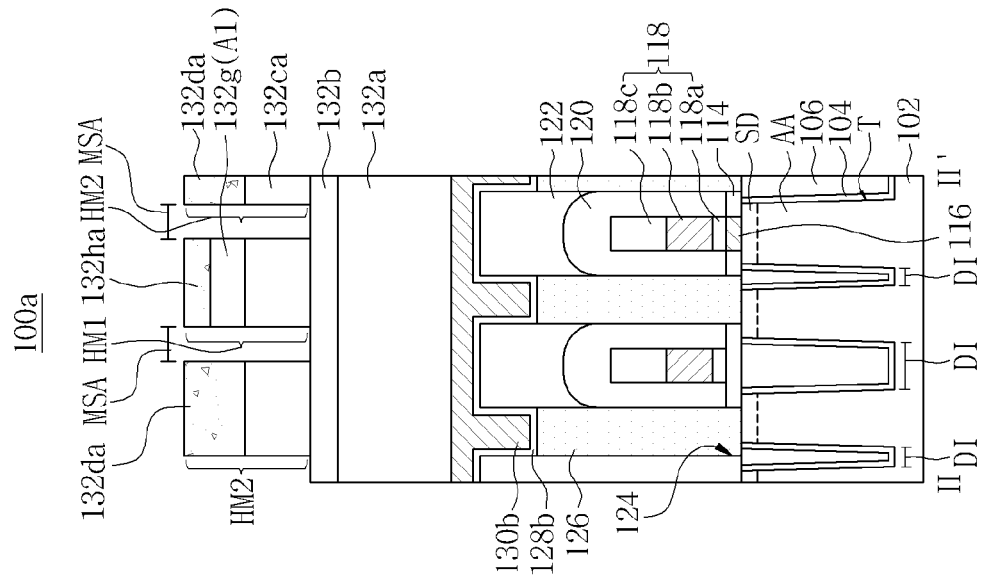
Figure 9B:
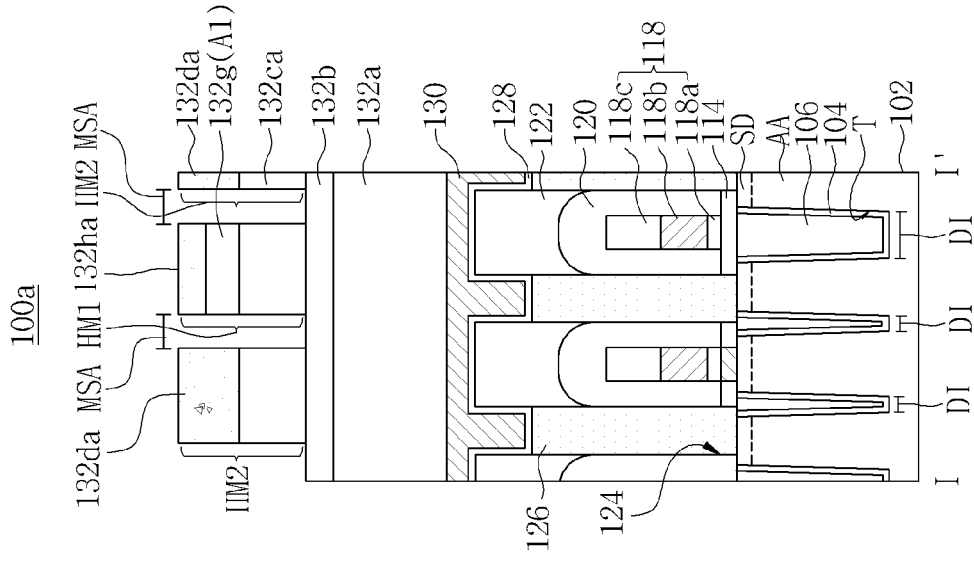
Figure 9D:
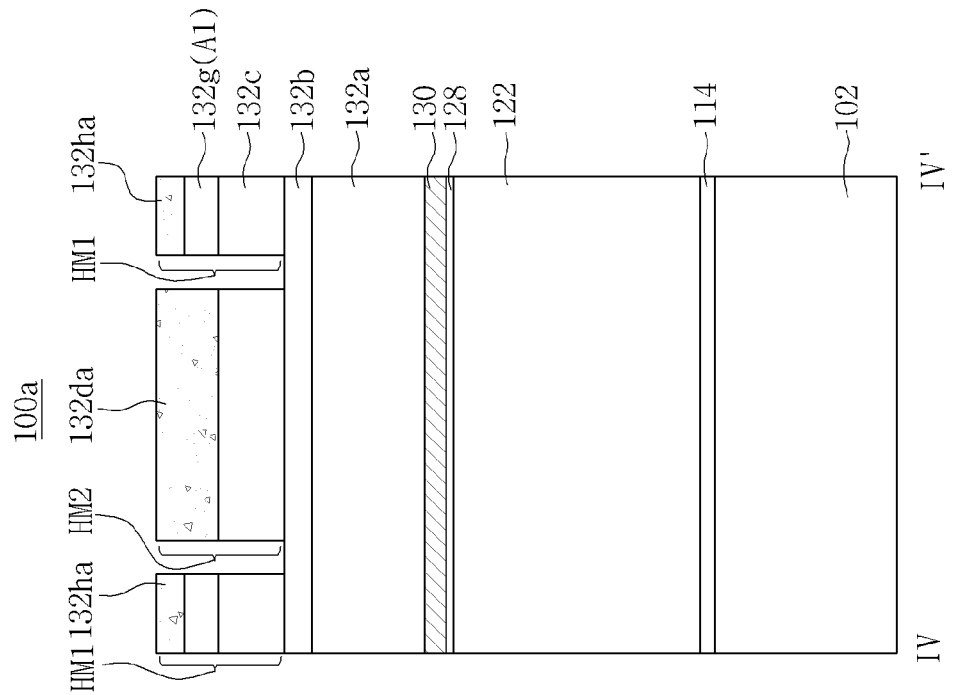
Figure 9C:
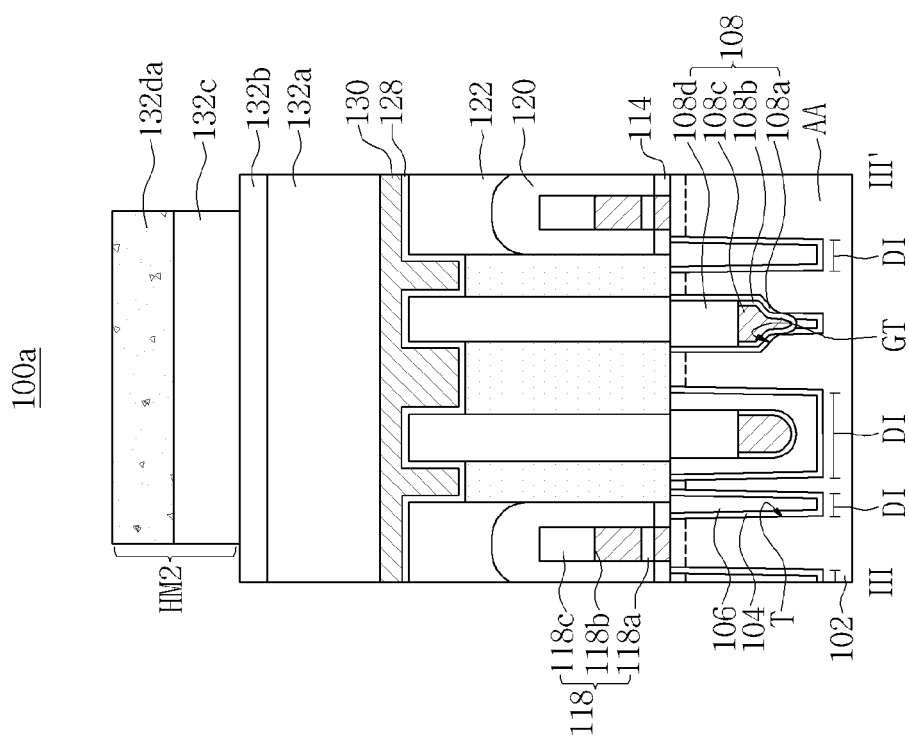
Figure 10A:
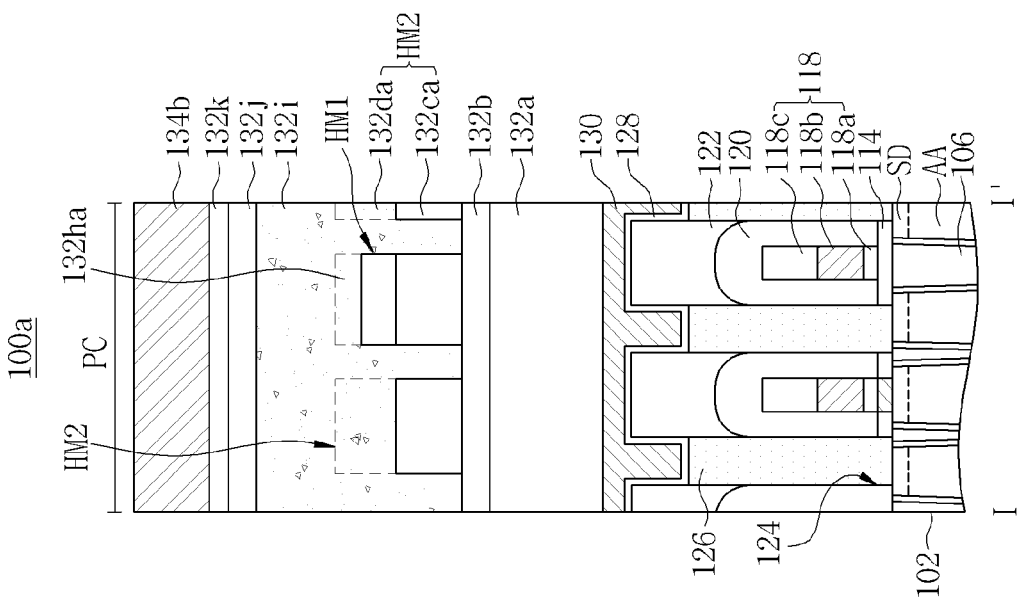
Figure 10B:
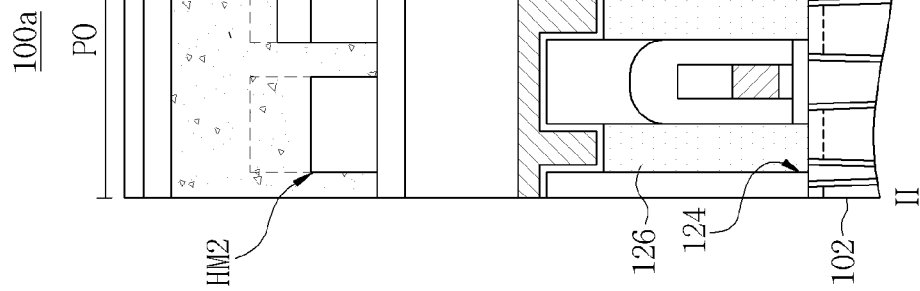
Figure 10D:
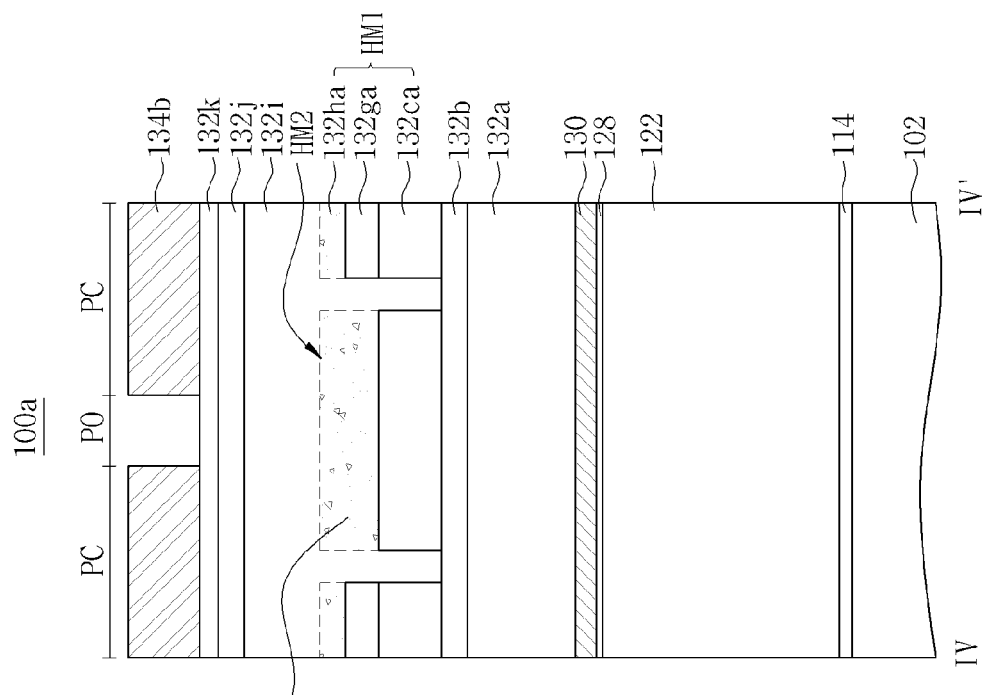
Figure 10C:
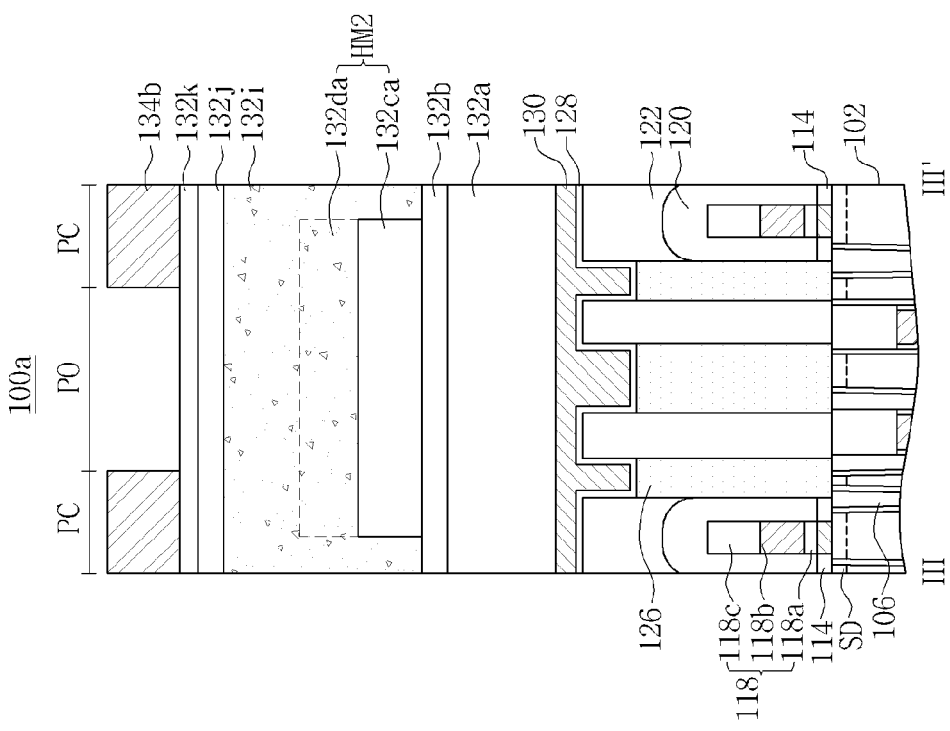
Figure 11B:
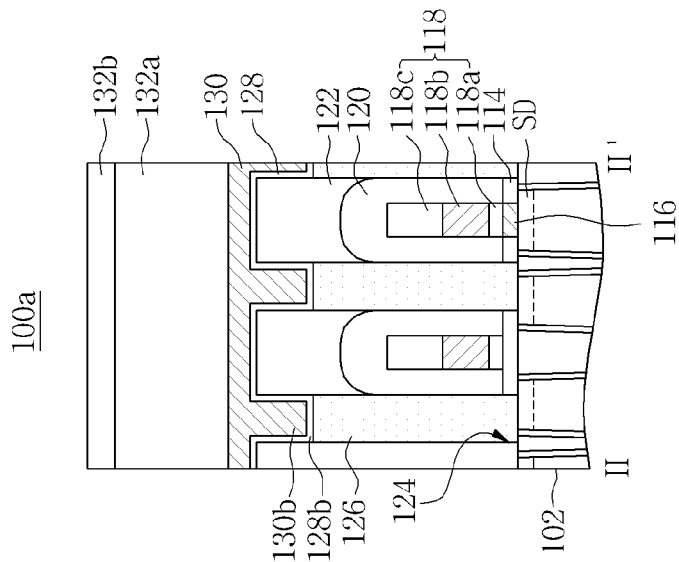
Figure 11A:
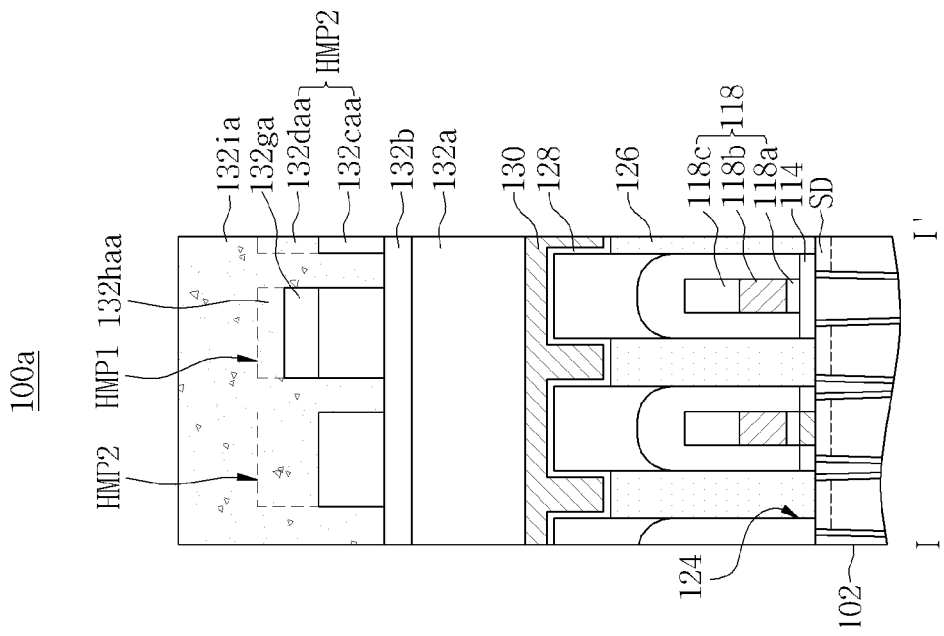
Figure 11D:
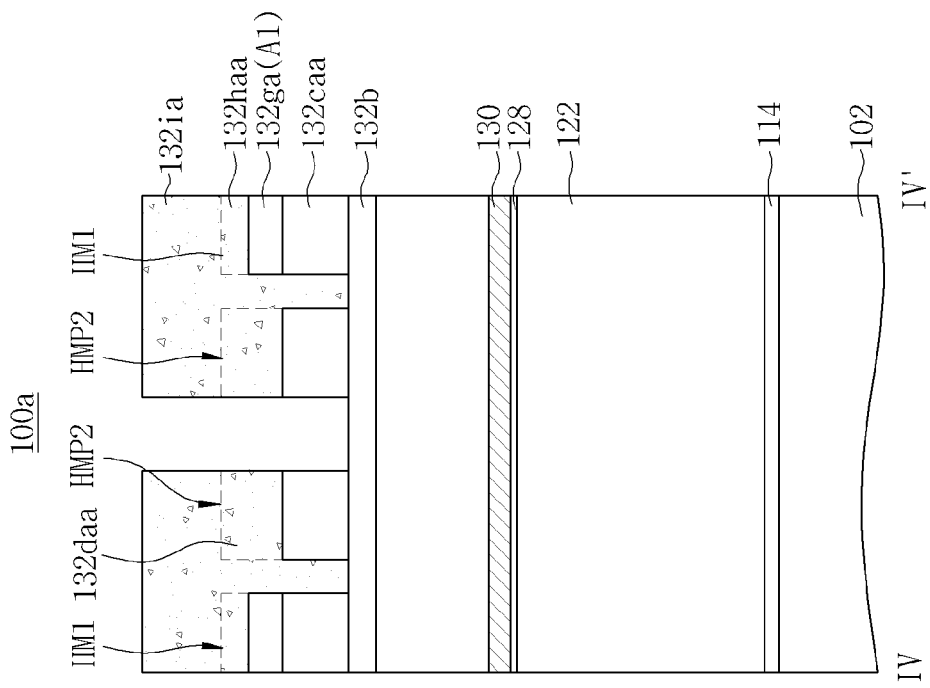
Figure 11C:
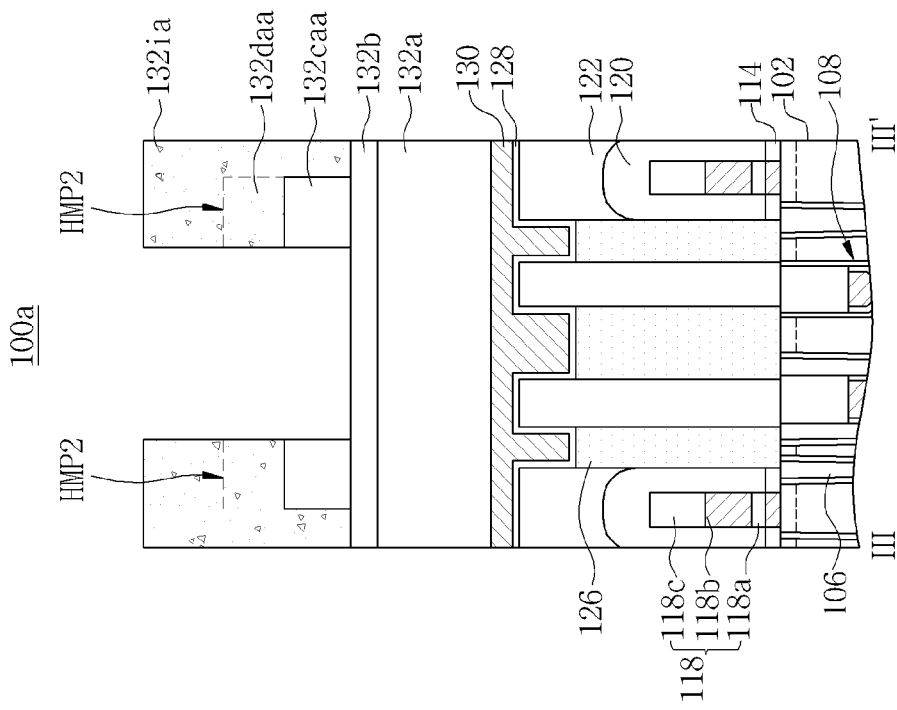
Figure 12A:
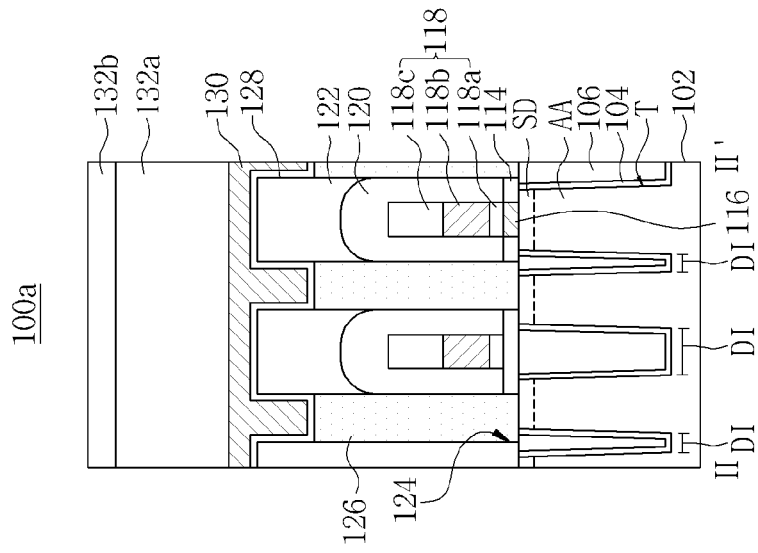
Figure 12B:
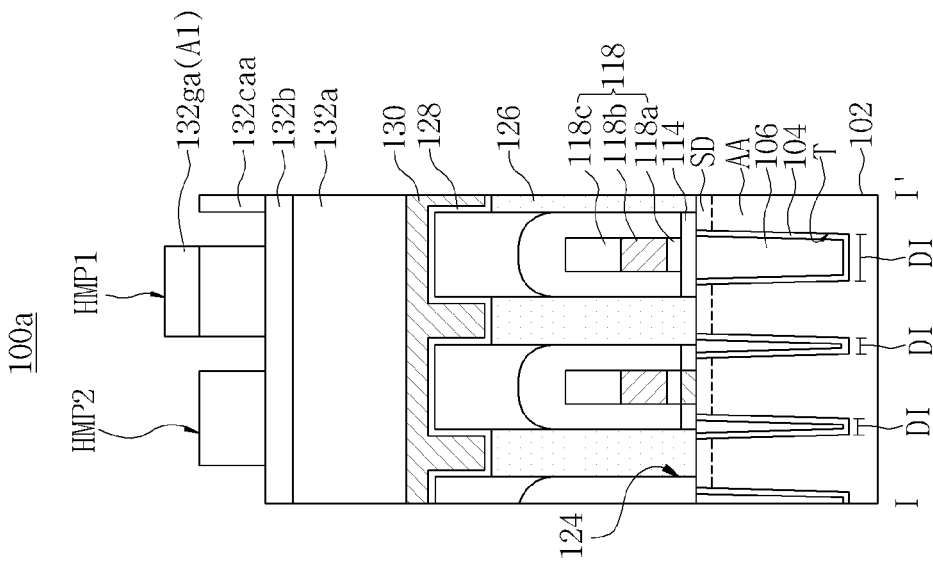
Figure 12D:
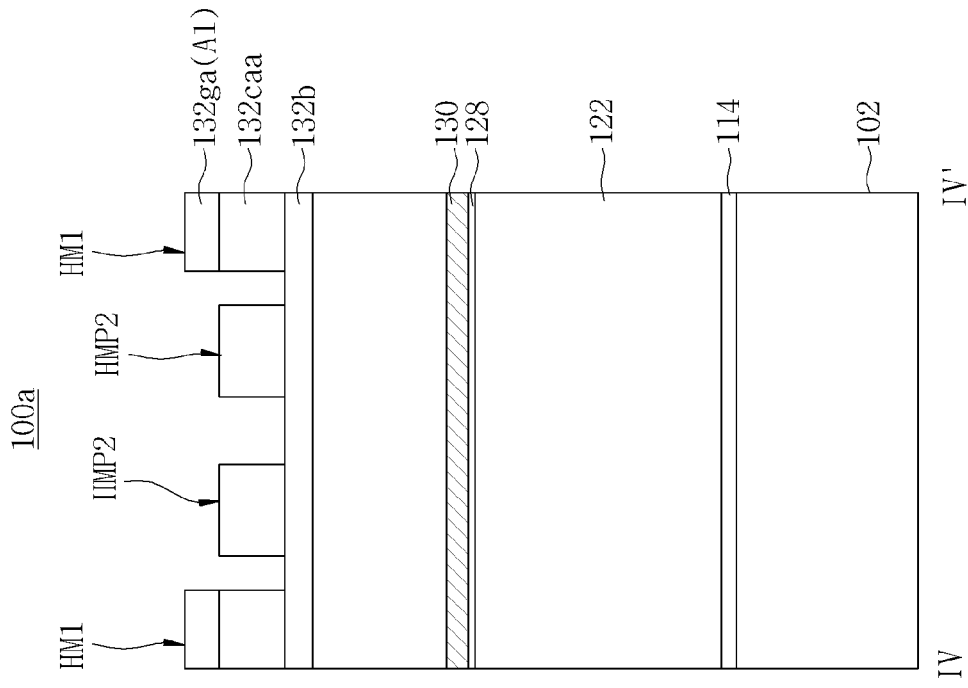
Figure 12C:
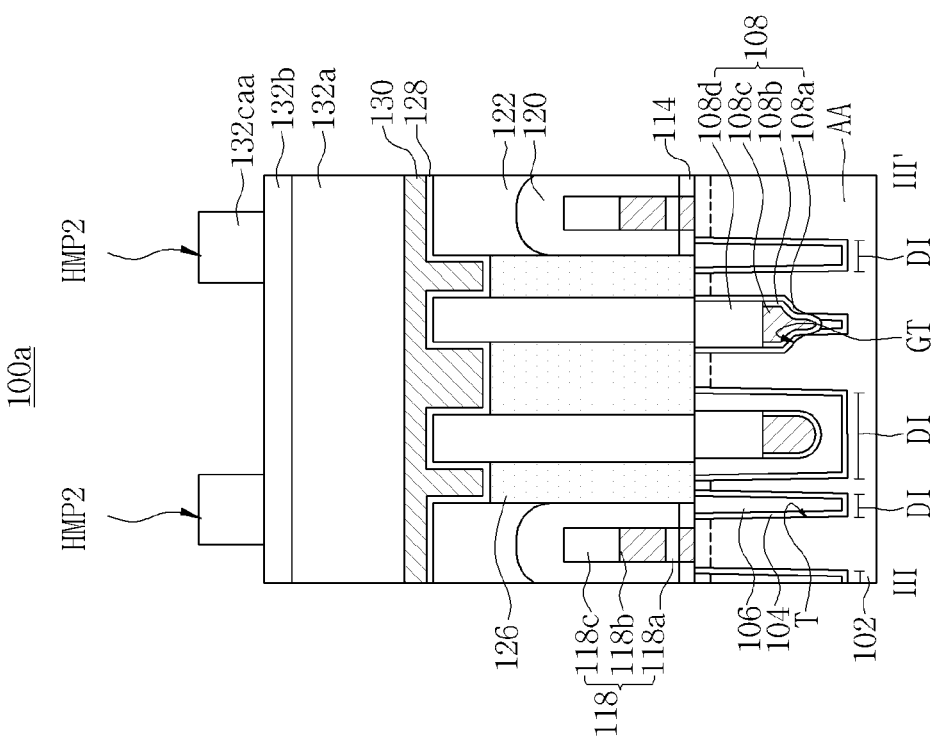
Figure 13A:
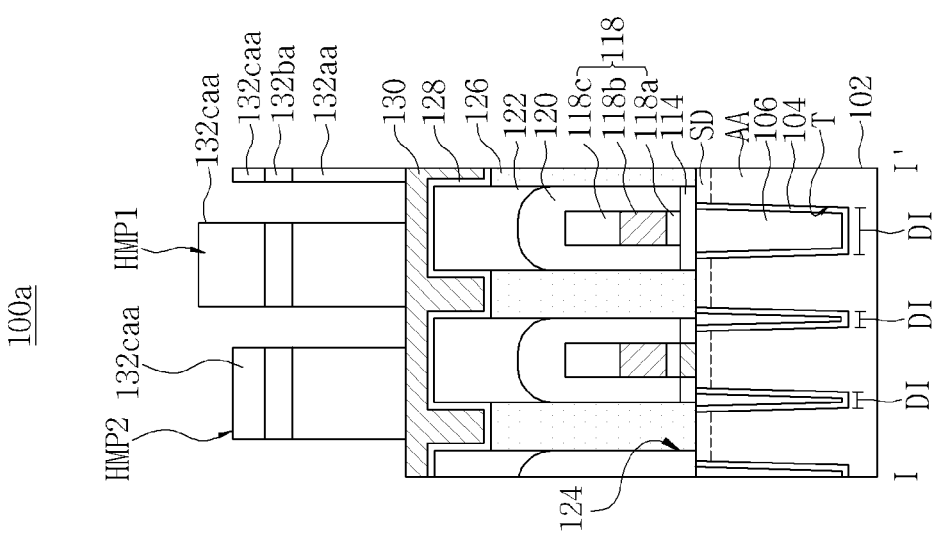
Figure 13B:
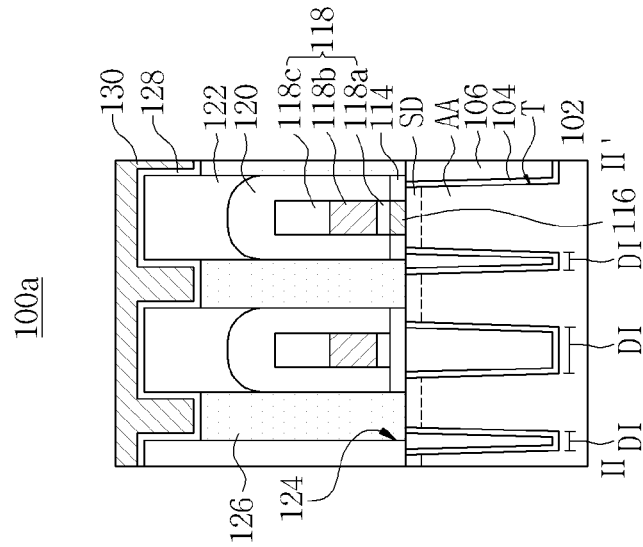
Figure 13C:
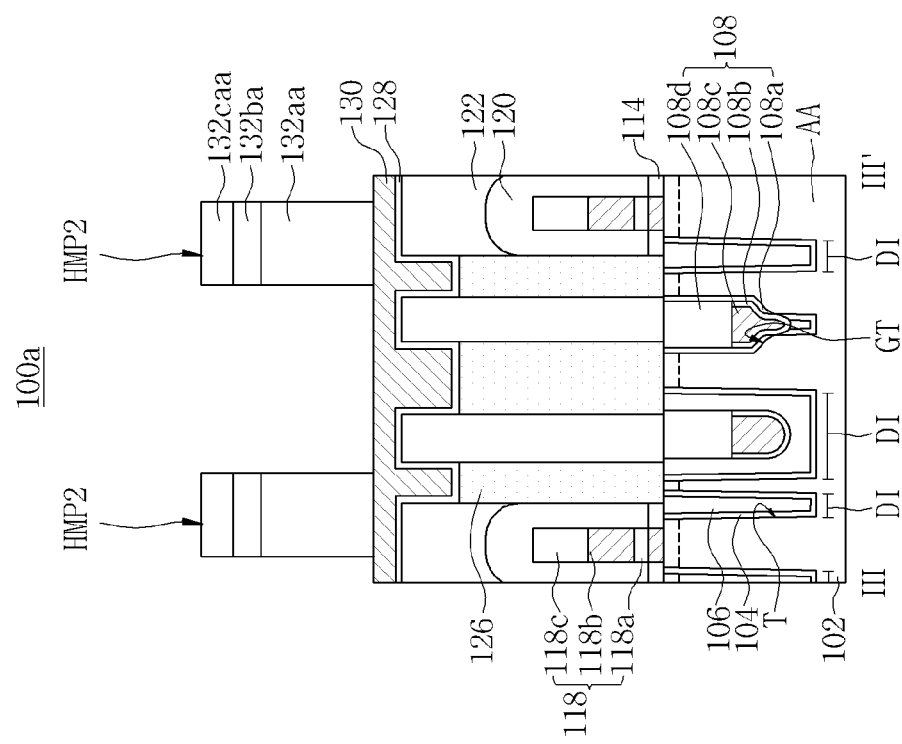
Figure 13D:
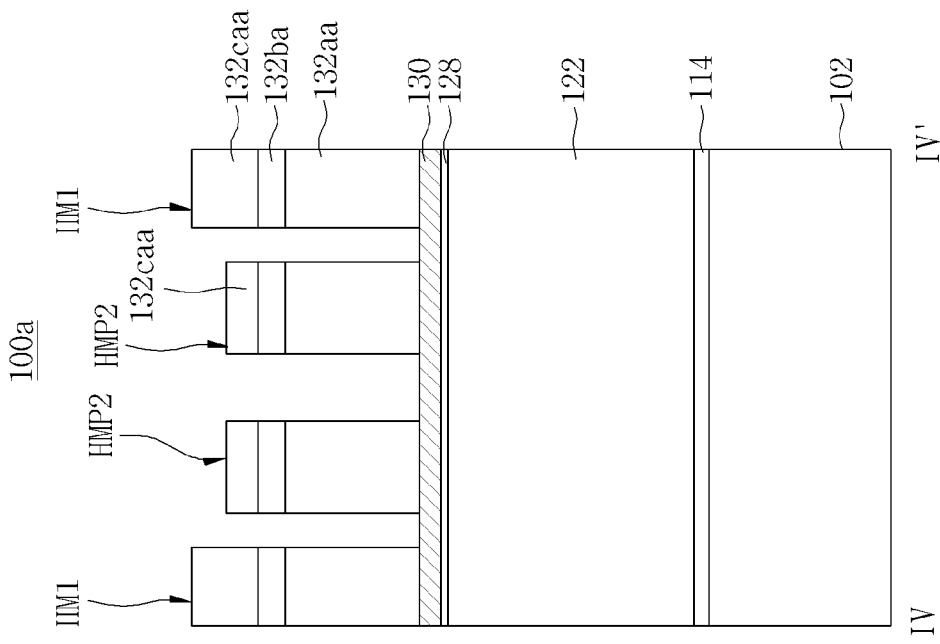
Figure 14D:
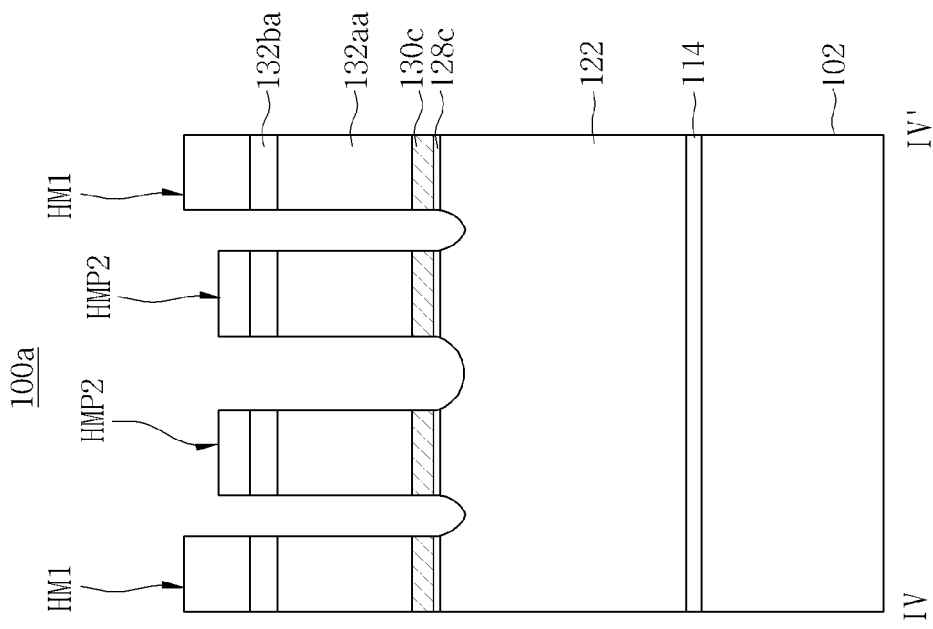
Figure 14C:
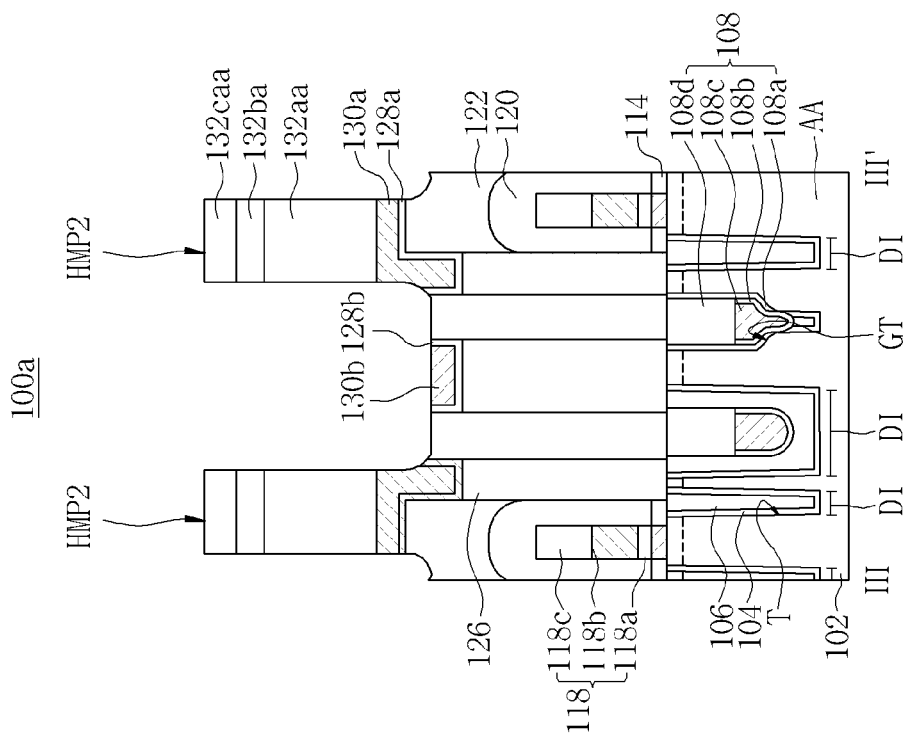
Figure 16A:
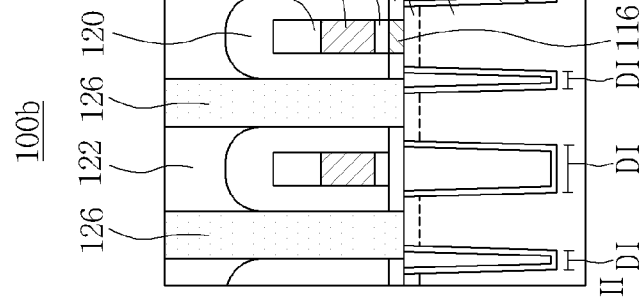
Figure 16B:
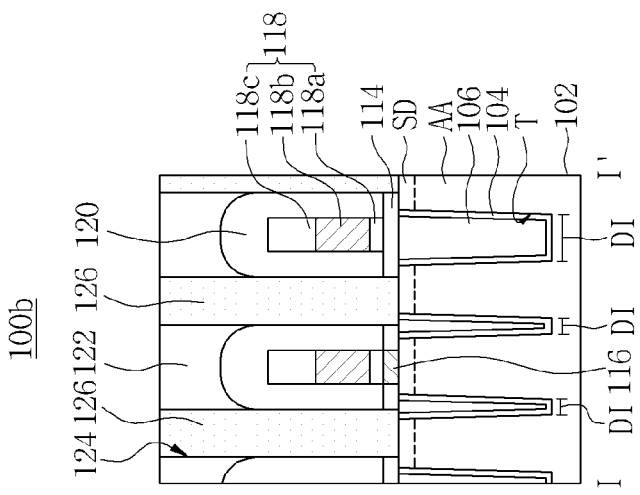
Figure 16D:
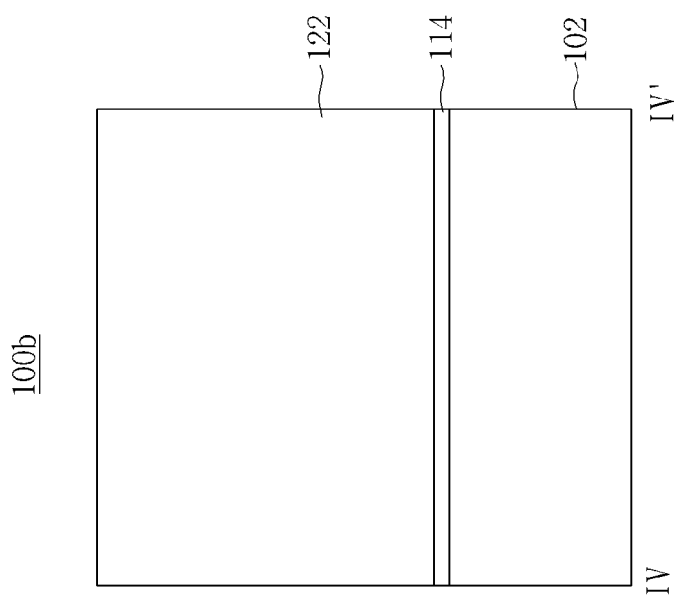
Figure 16C:
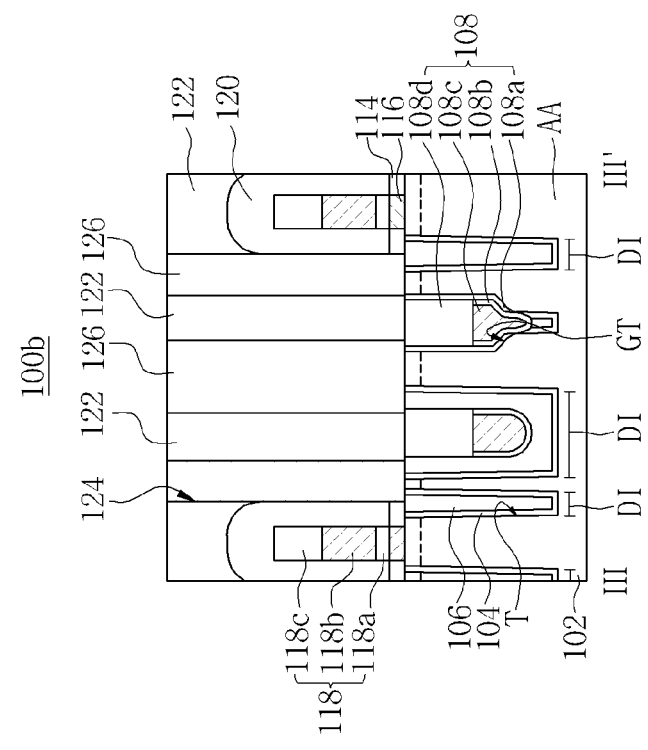
Figure 17B:
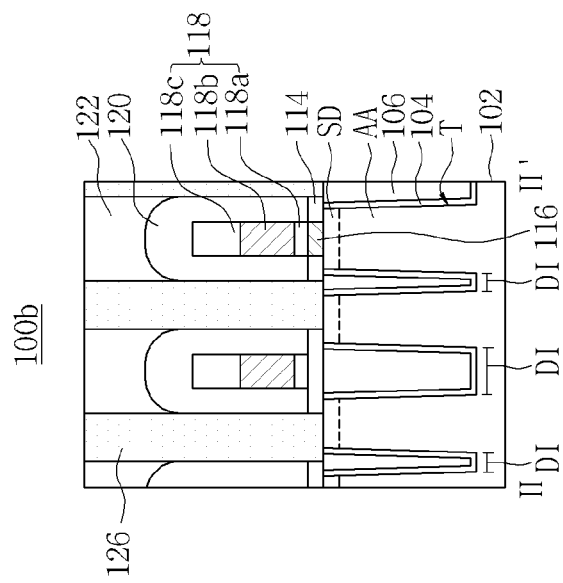
Figure 17A:
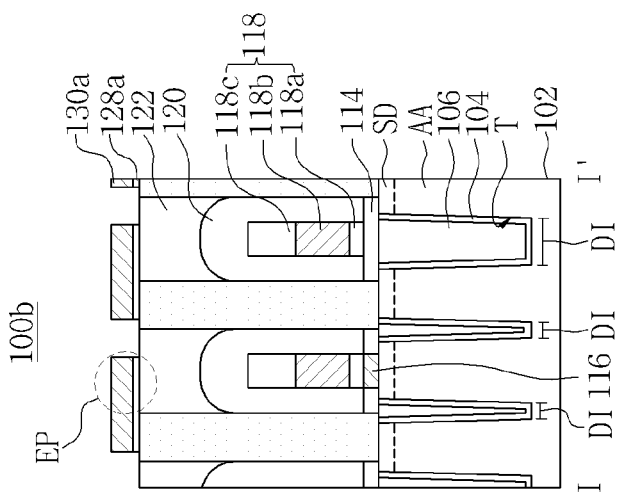
Figures 18C, 18D:
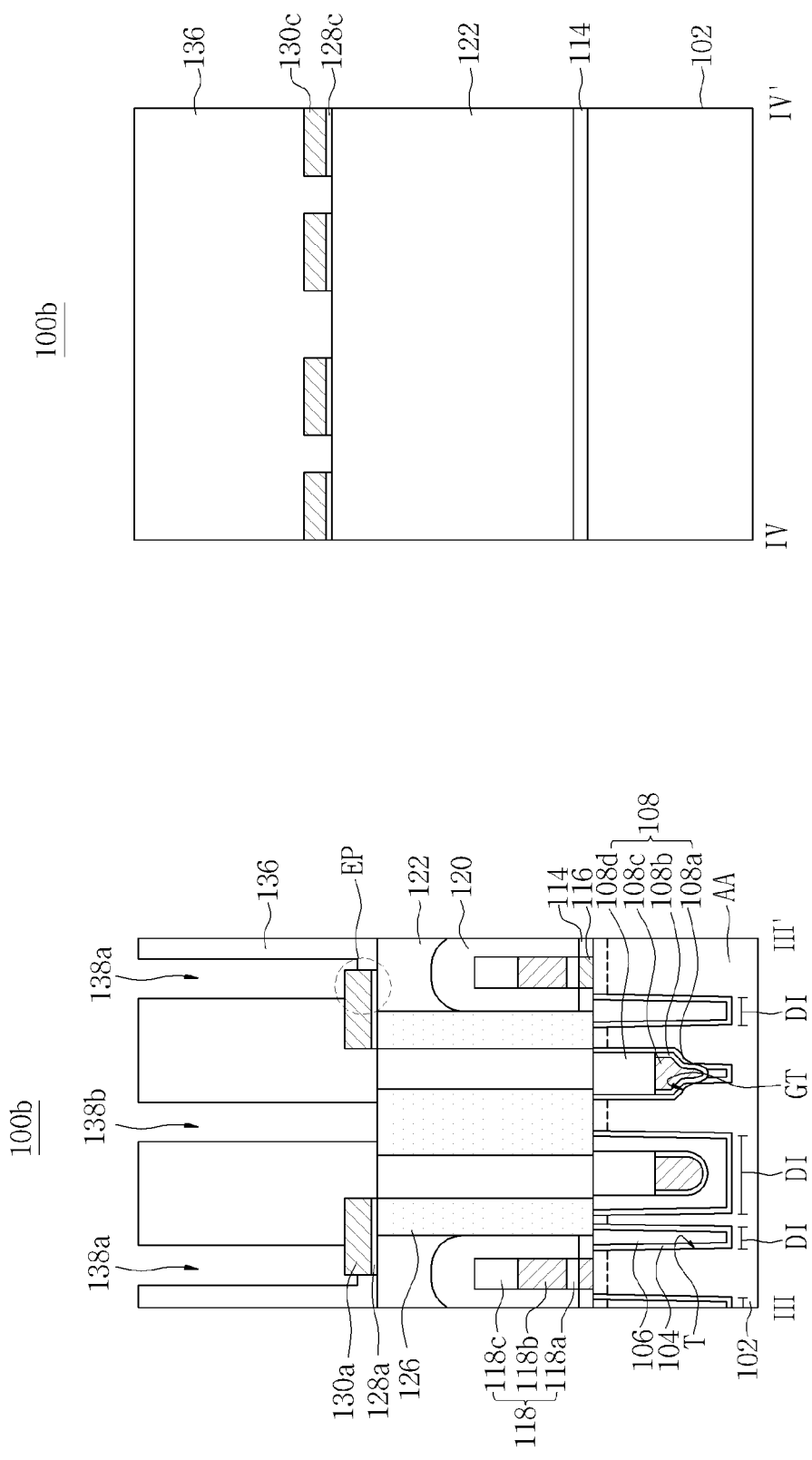

Referring first to FIGS. 1A and 1B, a memory device 100a may include a substrate 102, gate line stacks 108, bit line stacks 118, elongated conductive pads or pad contacts 130a (generically referred to hereinafter as "expanded landing pads"), regular conductive pads or pad contacts 130b (generically referred to hereinafter merely as "landing pads"), first storage nodes 140a, second storage nodes 140b, and bit lines 130c. The expanded landing pads 130a are larger, in terms of their footprints, than the landing pads 130b and thus, the landing pads 130b may be "relatively small" landing pads.

The device 100a may have cell area CA and peripheral area PA. The cell area CA may include bar-shaped, i.e., elongated, active areas AA, and a device isolation area DI, which isolates the active areas AA.

In the cell area CA, the gate line stacks 108 may extend across the active areas AA and the device isolation area DI in a first direction, and be spaced apart from each other in a second direction perpendicular to the first direction. Separation areas SA interposed between the gate line stacks 108 may include first separation areas SA1 and second separation areas SA2, which are alternately disposed in the second direction. The bit line stacks 118 may extend in the second direction, and be spaced apart from each other in the first direction.

Buried contacts 126 may correspond to areas among the first separation areas SA1 and the second separation areas SA2, in which the bit line stacks 118 do not cross, and be arranged in a row(s). The expanded landing pads 130a may contact the buried contacts 126 and be arranged in a row(s). Each expanded landing pad 130a is confined to a first separation area SA1, and occupies a region of the first separation area SA1 between adjacent bit line stacks 118 and adjacent gate line stacks 108 as viewed in plan. The landing pads 130b may also be arranged in a row(s). Each landing pad 130b is confined to a second separation area SA2, and occupies a region of the second separation area SA2 between adjacent bit line stacks 118 and adjacent gate line stacks 108 as viewed in plan. The expanded landing pads 130a and landing pads 130b may be alternately disposed in columns, which may be perpendicular to the rows. The memory device 100a may further include bit plugs 116 which contact the bit line stacks 118.

The expanded landing pads 130a may include expanded portions EP, each of which lies over one of adjacent bit line stacks 118. The first storage nodes 140a may contact the expanded portions EP of the expanded landing pads 130a, respectively. The second storage nodes 140b may contact the landing pads 130b, respectively. Referring to FIG. 1B, centers of the first storage nodes 140a may be offset from centers of the expanded landing pads 130a as viewed in plan, and the second storage nodes 140b may be disposed over the buried contacts 126 with the landing pads 130b being interposed therebetween. Widths of the landing pads 130b are smaller than those of the expanded landing pads 130a, and may be substantially the same as those of the buried contacts 126, as taken in a horizontal direction (the direction of the aforementioned rows).

Referring to FIG. 1C, bit lines 130c may be disposed in the peripheral area PA. The bit lines 130c may physically/electrically connect a source/drain area of a switching device disposed in the peripheral area to one end of each bit line stack 118.

One embodiment of the memory device will now be described in further detail with reference to FIGS. 2A to 2D, in addition to FIGS. 1A to 1C.

The substrate 102 has trenches T in a surface thereof. The trenches T, along with trench liners 104 that line the trenches T, and a device isolation layer 106 which covers the trench liners 104 and fills the trenches T, may be provided in the device isolation area DI. The active areas AA disposed in the cell area CA may be elongated in a direction oblique to the lengthwise directions of the gate line stacks 108 and bit line stacks 118. Source/drain areas SD may be formed in one end, the other end, and a central area of each active area AA.

The substrate 102 may comprise a silicon wafer or a silicon germanium wafer. The trench liners 104 may include a silicon oxide layer and a silicon nitride layer, which are sequentially stacked. The device isolation layer 106 may be formed of silicon oxide ($SiO_2$).

Gate trenches GT may be formed in the device isolation area DI and the active areas AA. Such gate trenches GT may be formed with different heights in the device isolation area DI and the active areas AA. For example, the gate trenches GT may have greater depths in the device isolation area DI than in the active areas AA.

Referring to FIGS. 1A and 2C, the adjacent gate line stacks 108 may cross respective portions of the active areas AA. Remaining portions of the active areas AA, which are not crossed by the gate line stacks 108, may be the source/drain areas SD. Thus, the source/drain areas SD may be spaced in each active area AA by the width of a gate line stack 108.

The gate line stacks 108 each may include a gate insulating layer 108a, a gate barrier layer 108b, a gate line 108c, which contacts the gate barrier layer 108b and fills a portion of the gate trench GT, and a gate capping layer 108d, which is formed on the gate line 108c and fills a remaining portion of the gate trench GT. The gate line 108c may fill ½ or less than ½ of the gate trench GT. The top surface of the gate line 108c may be disposed at the same level as that of the gate barrier layer 108b. The top surface of the gate capping layer 108d may be disposed at the same level as those of the device isolation layer 106 and active area AA.

The gate insulating layer 108a may comprise a layer of a metal oxide having a high dielectric constant such as a silicon oxide layer ($SiO_2$) or a hafnium oxide layer (HfOx). The gate barrier layer 108b may comprise a barrier metal such as titanium (Ti), titanium nitride (TiN), tantalum (Ta), tantalum nitride (TaN), ruthenium (Ru), ruthenium nitride (RuN), or tungsten nitride (WN). The gate line 108c may comprise a conductive material such as tungsten. The gate capping layer 108d may comprise an insulating material such as silicon nitride (SiNx).

The bit line stacks 118 each may include a bit line barrier layer 118a, a bit line layer 118b, and a bit line capping layer 118c which are stacked sequentially. A bit line sidewall spacer layer 120 may be provided over the bit line barrier layer 118a, the bit line layer 118b, and the bit line capping layer 118c.

The bit line barrier layer 118a may comprise titanium (Ti), tantalum (Ta), tantalum nitride (TaN), tungsten nitride (WN), titanium nitride (TiN), or another barrier metal. The bit line layer 118b may comprise tungsten (W), aluminum (Al), copper (Cu), nickel (Ni) or the like, and the bit line capping layer 118c may comprise silicon nitride (SiNx). The bit line sidewall spacer 120 may comprise silicon nitride (SiNx).

A first interlayer insulating layer 114 may be disposed under the bit line stacks 118. Bit plugs 116 extend through the first interlayer insulating layer 114 and electrically connect to the active area AA disposed thereunder and the bit line stacks 118 disposed thereon. Each bit plug 116 may contact the source/drain area SD which is formed at the center of the active area AA.

The first interlayer insulating layer 114 may comprise silicon oxide ($SiO_2$), and the bit plug 116 may comprise conductive material such as a doped silicon, a metal, or a metal silicide.

A second interlayer insulating layer 122 may cover the bit line stacks 118. Buried contact holes 124 may pass through the second interlayer insulating layer 122 and expose the source/drain areas SD formed at the ends of the active area AA. Each buried contact 126 may fill a buried contact hole 124, and be physically and electrically connected to a source/drain area SD. The second interlayer insulating layer 122 may comprise silicon oxide ($SiO_2$). The buried contacts 126 may comprise polysilicon doped with impurities.

Upper surfaces of the expanded landing pads 130a may be disposed at a level higher than those of the landing pads 130b. Thicknesses of the expanded landing pads 130a may be greater than those of the landing pads 130b. Expanded landing pad barriers 128a may be disposed under the expanded landing pads 130a, and landing pad barriers 128b may be disposed under the landing pads 130b. Bit lines 130C may be formed in the peripheral area PA. Bit line barriers 128c may be disposed under the bit lines 130c.

The expanded landing pads 130a, the landing pads 130b, and the bit lines 130c may comprise tungsten (W), aluminum (Al), copper (Cu), or nickel (Ni). The expanded landing pad barrier 128a, the landing pad barrier 128b, and the bit line barrier 128c may comprise a barrier metal such as titanium (Ti), titanium nitride (TiN), tantalum (Ta), tantalum nitride (TaN), ruthenium (Ru), ruthenium nitride (RuN), or tungsten nitride (WN).

A third interlayer insulating layer 136 may cover the second interlayer insulating layer 122. First storage contact holes 138a and second storage contact holes 138b may extend through the third interlayer insulating layer 136. The expanded portion EP, which extends over the bit line stack 118, may be exposed through the first storage contact hole 138a. The landing pads 130b may be exposed through the second storage contact holes 138b. The first storage nodes 140a may fill the first storage contact holes 138a, and electrically connect to the expanded landing pads 130a. The second storage nodes 140b may fill the second storage contact holes 138b, and be electrically connected to the landing pads 130b. The height of the second storage node 140b may be greater than that of the first storage node 140a.

The third interlayer insulating layer 136 may comprise silicon oxide ($SiO_2$). The first and second storage nodes 140a and 140b may comprise a conductive metal such as tungsten (W).

Another embodiment of a memory device 100b in accordance with the inventive concept will now be described with reference to FIGS. 3A to 3D. However, note, features of the device 100b may be similar to those of the device 100a, in which case they are disposed similarly. Therefore, like reference characters/numerals designate like elements/features and reference to FIG. 1A may be made for illustration of these like elements/features and the layout of such elements/features.

The memory device 100b may include a substrate 102, gate line stacks 108, bit line stacks 118, buried contacts 126, expanded landing pads 130a, first storage nodes 140a, second storage nodes 140b, and bit lines 130c.

The memory device 100b may have a cell area CA and a peripheral area PA, and the gate line stacks 108, the bit line stacks 118, the buried contacts 126, the expanded landing pads 130, and the storage nodes 140a and 140b may be disposed in the cell area CA. The bit lines 130c may be disposed in the peripheral area PA.

The expanded landing pads 130a may be arranged in rows in first separation areas SA1 between adjacent gate line stacks 108 of respective pairs thereof. The expanded landing pads 130a may extend over adjacent bit line stacks 118. The buried contacts 126 are arranged in a rows, some of which are respectively provided the first separation areas SA1, and others of which are respectively provided in second separation areas SA2 between adjacent gate line stacks 108 of other respective pairs thereof. None of the expanded landing pads 130a are provided in a second separation area SA2.

The first storage nodes 140a may contact the expanded landing pads 130a, and the second storage nodes 140b may contact the buried contacts 126. The first storage nodes 140a may contact expanded portions EP of the expanded landing pads 130a that extend over the bit line stacks 118. Centers of the first storage nodes 140a may be offset from those of the expanded landing pads 130a. The height of the second storage nodes 140b may be greater than that of the first storage node 140a.

As mentioned above, the embodiments of memory devices 100a and 100b in accordance with the inventive concept include expanded landing pads 130a having the expanded portions EP. Thus, a process margin for forming the storage nodes may be ensured. Also, the expanded landing pads 130a may have a critical dimension on the order of that of the bit lines 130c in the peripheral area PA. Thus, the same illumination system as that used to form the bit lines 130c in the peripheral area PA may be used to form the expanded landing pads 130a. This also allows the exposure processes used in fabricating the devices 100a and 100b to be minimized.

Hereinafter, a method of manufacturing a memory device in accordance with the inventive concept will be described with reference to FIGS. 4A to 15D. Reference will also be made to the memory device 100a, illustrated in FIGS. 1A to 2D, as an example of the device that can be made by the method.

Referring first to FIGS. 4A to 4D, the method of manufacturing a memory device 100a according to the inventive concept may include forming trenches T in device isolation area DI of a substrate 102, forming trench liners 104 and a device isolation layer 106 in the trenches T to provide a trench isolation structure, forming gate trenches GT in the resulting structure including in the trench isolation structure, and forming gate line stacks 108 in the gate trenches GT.

The substrate 102 at this time may have a dedicated cell area CA and peripheral area PA corresponding to those of the device. Active areas AA and the device isolation area DI may be formed in the cell area CA. Those parts of the substrate 102, in which the trenches T are not formed, may be the active areas AA. Each active area AA may be formed in the shape of an elongated island or bar. The active areas AA may be uniformly arranged according to a design rule. The trench liner 104 may line the trench T. The device isolation layer 106 may fill the trench T.

The gate trenches GT may extend in a first direction parallel to an upper surface of the substrate 102. The gate trenches GT may be spaced apart from each other in a second direction parallel to the upper surface of the substrate 102 and perpendicular to the first direction. The gate trenches GT may be formed along the device isolation layer 106 and the active areas AA. The gate line stack 108 may include a gate insulating layer 108a, a gate barrier layer 108b, a gate line 108c, and a gate capping layer 108d, which are sequentially formed in the gate trench GT. The gate line stack 108 may fill the gate trench GT. The gate line 108c and the gate barrier layer 108b may occupy less than the bottom half of the gate trench GT. Impurities may be implanted into parts of the active areas AA adjacent to the gate line stacks 108 to form source/drain regions or areas SD.

The device isolation layer 106 may comprise silicon oxide ($SiO_2$). The gate insulating layer 108a may be formed by oxidizing the surfaces that delimit the gate trenches GT. The gate barrier layer 108b may comprise titanium (Ti), titanium nitride (TiN), tantalum (Ta), tantalum nitride (TaN), or titanium tungsten (TiW). The gate line 108c, for example, may be formed of tungsten (W). The gate capping layer 108d may comprise silicon nitride (SiNx).

The method of manufacturing the memory device 100a may further include forming a first interlayer insulating layer 114, bit plugs 116, bit line stacks 118, and a bit line sidewall spacer layer 120.

The bit plug 116 may be formed through the first interlayer insulating layer 114 and may contact a surface of the source/drain area SD formed at the center of an active area AA. The bit line stacks 118 may extend in a direction perpendicular to the gate line stacks 108. The bit line stacks 118 may include a bit line barrier layer 118a, a bit line layer 118b, and a bit line capping layer 118c, which are sequentially stacked. The bit line sidewall spacer layer 120 may cover the bit line barrier layer 118a, the bit line layer 118b, and the bit line capping layer 118c.

The first interlayer insulating layer 114 may comprise silicon oxide ($SiO_2$). The bit plug 116 may comprise a conductive material such as doped polysilicon or a metal. The bit line barrier layer 118a may comprise titanium (Ti), tantalum (Ta), tantalum nitride (TaN), tungsten nitride (WN), or titanium nitride (TiN). The bit line layer 118b may comprise tungsten (W), aluminum (Al), copper (Cu), or nickel (Ni). The bit line capping layer 118c may comprise silicon nitride (SiNx). The bit line sidewall spacer layer 120 may comprise silicon nitride (SiNx). The bit plug 116 may comprise a conductive material such as a doped silicon, a metal, or a metal silicide.

The method of manufacturing the memory device 100a may further include forming a second interlayer insulating layer 122, buried contact holes 124, and buried contacts 126.

The second interlayer insulating layer 122 may be formed across the entire surface of the substrate 102. The buried contact holes 124, referring to FIG. 1, may be formed by removing portions of the second interlayer insulating layer 122 located between respective ones of the bit line stacks 118. Each buried contact hole 124 may expose a source/drain area SD. Facing one side of each buried contact hole 124 may be an outer wall surface of the bit line sidewall spacer 120, facing the other side of each buried contact hole 124 may be an inner wall surface of the recessed second interlayer insulating layer 122. The buried contacts 126 may be formed by filling the buried contact holes 124 and then performing a selective etch-back process on the resulting structure so as to recess the layer filling the buried contact holes 124 into the buried contact holes 124. In this way, upper surfaces of the buried contacts 126 may be disposed at a level lower than that of the upper surface of the second interlayer insulating layer 122. The buried contacts 126 may be arranged in a matrix. The second interlayer insulating layer 122 may comprise silicon oxide ($SiO_2$). The buried contacts 126 may comprise polysilicon doped with impurities.

The above-described elements and features may be formed by well known processes that are conventional per se, such as photolithography, etching, deposition, planarization, ion implantation and etch-back processes and will not be described here in detail. That is, those of ordinary skill in the art will readily appreciate the processes by which the structure shown in FIGS. 4A-4D can be formed.

Referring to FIGS. 5A to 5D, the method of manufacturing the memory device 100a may include forming a landing barrier layer 128, a landing pad layer 130, a hard mask stack 132, and a first PR pattern 134a.

The landing barrier layer 128 may be conformally formed so as to extend along upper surfaces of the buried contacts 126, exposed sides of the buried contact holes 124, and an upper surface of the second interlayer insulating layer 122. The landing pad layer 130 may contact the landing barrier layer 128, and fill remaining portions of the buried contact holes 124. The mask stack 132 may include a first mask layer 132a, a second mask layer 132b, a third mask layer 132c, a fourth mask layer 132d, a fifth mask layer 132e, and a sixth mask layer 132f.

The first PR pattern 134a may include open areas PO and closed areas PC. The open areas PO and the closed areas PC may be alternately formed, and be constituted by a pattern of stripes extending in the same direction as the bit line stacks 118. Each closed area PC may extend directly over a bit line stack 118 and a portion of the bit line stack 118 adjacent thereto. Each open area PO may extend directly over a region between adjacent bit line stacks 118, and a remaining portion of the bit line stack 118, which is not covered by the closed area PC.

The landing barrier layer 128 may comprise titanium (Ti), titanium nitride (TiN), tantalum (Ta), tantalum nitride (TaN), or titanium tungsten (TiW). The landing pad layer 130, for example, may be formed of tungsten (W). The first mask layer 132a may be an amorphous carbon layer (ACL). The second mask layer 132b may be a first silicon oxynitride (SiON). The third mask layer 132c may be an oxide layer. The fourth mask layer 132d may be a spin on hard mask layer (SOH layer). The fifth mask layer 132e may be a second silicon oxynitride (SiON). The sixth mask layer 132f may be a bottom anti-reflective coating (BARC) layer.

The hard mask stack 132 is used to transcribe the first PR pattern 134a. Otherwise, the first PR pattern 134a may collapse. That is, the height of the first PR pattern 134 is minimal to prevent it from having such a great aspect ratio that it could collapse. However, the first PR pattern 134a alone, and having an aspect ratio that ensures it will not collapse, may not be able to transcribe its pattern to a desired depth. The hard mask stack 132 provided according to an aspect of the inventive concept obviates these potential problems, i.e., the hard mask stack 132 and PR pattern 134a are capable of transcribing the first PR pattern 134a to a sufficient depth on the substrate 102 without the first PR pattern 134a collapsing.

For example, an ACL layer, which is the first mask layer 132a, and silicon oxynitride (SiON) layers, which are the second and fifth mask layers 132e, have good properties in etch selectivity or etch resistance. The fourth mask layer 132d may be a first SOH. A BARC layer, which is the sixth mask layer 132f, prevents deformation of the first PR pattern 134a, which can be caused by undesired reflection and diffusion by absorption of light used to expose and pattern the photoresist to form the first PR pattern 134a.

Referring to FIGS. 6A to 6D, the method of manufacturing the memory device 100a may include forming a fourth mask pattern (SOH pattern) 132da and a fifth mask pattern (SiON pattern) 132ea, using the first PR pattern 134a as an etch mask, so that the fourth mask pattern (SOH pattern) 132da and a fifth mask pattern (SiON pattern) 132ea have the same pattern as the first PR pattern 134a.

The first PR pattern 134a and the sixth mask pattern (BARC layer) 132f disposed thereunder may be removed. The third mask layer (SiON layer) 132c may be exposed by the stacked fourth and fifth mask patterns 132da and 132ea.

Referring to FIGS. 7A to 7D, the method of manufacturing the memory device 100a may include forming a seventh mask layer 132g, which conformally covers the stacked fourth and fifth mask patterns 132da and 132ea, and the third mask layer 132c, and an eighth mask layer 132h which covers the seventh mask layer 132g and fills the recesses defined by the seventh mask layer 132g.

The seventh mask layer 132g may include first horizontal segments A1, which contact exposed surfaces of the first mask layer 132c, vertical segments B, which contact side surfaces of the fourth mask pattern 132da and the fifth mask pattern 132ea, and second horizontal segments A2, which contact planar surfaces of the fifth mask pattern 132ea.

The seventh mask layer 132g may comprise an oxide. The eighth mask layer 132h may be a second SOH layer.

Referring to FIGS. 8A to 8D, the method of manufacturing the memory device 100a may include forming eighth mask patterns 132ha by recessing the eighth mask layer 132h, removing the second horizontal segments A2 of the seventh mask layer 132g, and removing the fifth mask pattern 132ea.

Surfaces of the vertical segments B of the seventh mask layer 132g may be exposed. The upper surface of the eighth mask patterns 132ha may be disposed at the same level as that of the fourth mask patterns 132da. The upper surfaces of the vertical segments B of the seventh mask layer 132g may be disposed at a level higher than those of the eighth mask patterns 132ha and those of the fourth mask patterns 132da.

Referring to FIGS. 9A to 9D, the method of manufacturing the memory device 100a may include forming first hard mask stacks HM1 and second hard mask stacks HM2 on the second mask layer 132b.

The first hard mask stacks HM1 may include a third mask pattern 132ca, a first horizontal segment of the seventh mask layer 132g, and the eighth mask pattern 132ha, which are sequentially stacked. The second hard mask stacks HM2 may include the third hard mask pattern 132ca and the fourth hard mask pattern 132da, which are sequentially stacked.

The forming of the first hard mask stack HM1 and the second hard mask stack HM2 may include removing the vertical segments B of the sixth mask layer 132g, and removing the third mask layer 132c from the areas from which the vertical segments B are removed. A portion of the third mask layer 132c may be removed. As a result, the third mask patterns 132ca may be formed.

The first hard mask stack HM1 and the second hard mask stack HM2 may extend in the longitudinal direction of the bit line stacks 118, and may be alternately formed across the cell area CA and the peripheral area PA. The first hard mask stacks HM1 and the second hard mask stacks HM2 may be spaced apart from each other by the areas from which the vertical segments B of the seventh mask layer 132g were removed. In the cell area CA, a separation area MSA between the first hard mask stack HM1 and the second hard mask stack HM2 may be located directly over one side of a bit line stack 118.

Referring to FIGS. 10A to 10D, the method of manufacturing the memory device 100a may include forming a ninth mask layer 132i, a tenth mask layer 132j, an eleventh mask layer 132k, and a second PR pattern 134b.

The second PR pattern 134b may include open areas PO and closed areas PC. For example, in the cell area CA, the open areas PO and the closed areas PC may be formed alternately with respect to each other and extend in the longitudinal direction of the gate line stacks 108. In the peripheral area PA, the open areas PO and the closed areas PC may be formed alternately with respect to each other. In the cell area CA, the open area PO and the closed area PC of the second PR pattern 134b may cross over the first hard mask stack HM1 and the second hard mask stack HM2 at right angles. The closed areas PC of the second PR pattern 134b, referring to FIG. 1A, may widely cover the first separation areas SA1 between the gate line stacks 108. Thus, the open areas PO of the second PR pattern 134b may correspond to the second separation area SA2 between the gate line stacks 108.

The ninth mask layer 132i may comprise an SOH layer. The tenth mask layer 132j may comprise a silicon oxynitride (SiON) layer. The eleventh mask layer 132k may comprise a BARC layer.

Referring to FIGS. 11A to 11D, the method of manufacturing the memory device 100a may include forming ninth mask patterns 132ia.

The forming of the ninth mask patterns 132ia may include removing the eleventh mask layer 132k, the tenth mask layer 132j, and the ninth mask layer 132i, and removing the hard mask stack HM1 and the second hard mask stack HM2 from areas corresponding to the open areas PO of the second PR pattern 134b.

In this process, the tenth mask layer 132j, which is formed by and thus has the pattern of the closed areas PC of the second PR pattern 134b, may be used as an etching mask to pattern the ninth mask layer 132i disposed thereunder. First hard mask stack patterns HMP1 and second hard mask stack patterns HMP2, each of which have an island shape, may be formed under the ninth mask pattern 132ia. Thus, the first hard mask stack pattern HMP1 may include a third mask pattern 132caa, a seventh mask pattern 132ga, and an eighth mask pattern 132haa, which all have an island shape. The second hard mask stack pattern HMP2 may include the third mask pattern 132caa and a fourth mask pattern 132daa, which have an island shape. The second hard mask stack HM2 in the peripheral area may be separated from the second hard mask stack pattern HMP2. The second mask layer 132b may be exposed in an area, in which the ninth mask patterns 132ia are not present.

Referring to FIGS. 12A to 12D, the method of manufacturing the memory device 100a may include removing the ninth mask patterns 132ia, which is the SOH layer, the eighth mask patterns 132haa of the first hard mask stack pattern HMP1, and the fourth mask patterns 132*daa* of the second hard mask stack patterns HMP2.

A surface of the second mask layer 132*b* around the first hard mask stack patterns HMP1 and the second hard mask stack patterns HMP2 may be exposed.

Referring to FIGS. 13A to 13D, the method of manufacturing the memory device 100*a* may include removing those parts of the second mask layer 132*b* and the first mask layer 132*a*, which are disposed under the first hard mask stack patterns HMP1 and the second hard mask stack patterns HMP2, using the first hard mask stack patterns HMP1 and the second hard mask stack patterns HMP2 as an etching mask. As a result, a second mask pattern 132*ba* and a first mask layer 132*aa* are formed. Also, a first horizontal pattern A1 of the seventh mask layer 133*ga* is removed.

Thus, the first hard mask stack pattern HMP1 and the second hard mask stack pattern HMP2 may include the first to third mask patterns 132*aa*, 132*ba*, and 132*caa*, which are sequentially stacked. The height of the third mask pattern 132*caa* of the first hard mask stack HMP1 may be reduced while the first horizontal pattern A1 of the seventh mask layer 132*ga* of the second hard mask stack pattern HMP2 is being removed.

In the cell area CA, the surface of the landing pad layer 130 peripheral to the first hard mask patterns HMP1 and the second hard mask patterns HMP2 may be exposed. At the same time, in the peripheral area PA, the landing pad layer 130 may be exposed between the first hard mask stack HM1 and the second hard mask stack patterns HMP2. The first hard mask stacks HM1 and the second hard mask stack patterns HMP2 in the peripheral area PA may extend in one direction.

Referring to FIGS. 14A to 14D, the method of manufacturing the memory device 100*a* may include forming the expanded (first) landing pads 130*a* and the (second) landing pads 130*b* in the cell area CA, and forming the bit lines 130*c* in the peripheral area PA.

The forming of the expanded landing pads 130*a*, the landing pads 130*b*, and the bit lines 130*c* may include removing the landing pad layer 130 in the cell area CA and the peripheral area PA and the landing barrier layer 128 disposed thereunder using the first hard mask patterns HMP1, the second hard mask patterns HMP2, and the first hard mask stacks HM1 as etching masks.

Thus, in the cell area CA, the expanded landing pad barriers 128*a* and the landing pad barriers 128*b* may be formed under the expanded landing pads 130*a* and the landing pads 130*b*, respectively. The bit lines 130*c*, which are in the peripheral area PA, and the bit line barriers 128*c*, which are under the bit lines 130*c*, may be formed.

Referring to FIG. 1B, the expanded landing pads 130*a* may be spaced apart from each other in the first separation area SA1 between the gate line stacks 108, and arranged in rows. The landing pads 130*b* may be spaced apart from each other in the second separation areas SA2 between the gate line stacks 108, and arranged in rows. Each expanded landing pad 130*a* may contact a buried contact 126, and have the expanded portion EP, which is an extension that extends over the bit line stack 118 adjacent to the buried contact 126 The landing pads 130*b* may be vertically aligned with the buried contacts 126 electrically connected thereto, respectively. Upper surfaces of the landing pads 130*b* may be formed at the same level as an upper surface of the second interlayer insulating layer 122. The expanded landing pads 130*a* and the landing pads 130*b* may be alternately arranged in each of several columns. Thicknesses of the expanded landing pads 130*a* may be greater than those of the landing pads 130*b*. Widths of the landing pads 130*b*, in a given horizontal direction (namely, the direction of the rows), may be smaller than those of the expanded landing pads 130*a*, and substantially the same as those of the buried contacts 126.

Referring to FIGS. 15A to 15D, the method of manufacturing the memory device 100*a* may include forming the third interlayer insulating layer 136, the first storage contact holes 138*a*, and the second storage contact holes 138*b*.

The first storage contact holes 138*a* and the second storage contact holes 138*b* may be formed through the third interlayer insulating layer 136. The first storage contact holes 138*a* may expose surfaces of the expanded portions EP of the expanded (first) landing pads 130*a*. The second storage contact holes 138*b* may expose surfaces of the (second) landing pads 130*b*.

In subsequent processes, referring to FIGS. 2A to 2D, the method of manufacturing the memory device 100*a* may include forming the first storage nodes 140*a* and the second storage nodes 140*b* in the first storage contact holes 138*a* and the second storage contact holes 138*b*, respectively.

The first storage nodes 140*a* may be physically and electrically connected to the expanded landing pads 130*a* at the expanded portions EP thereof, respectively. The second storage nodes 140*b* may be physically and electrically connected to the landing pads 130*b*. Thus, the centers of the first storage nodes 140 may be offset from the centers of the expanded landing pads 130*a*. The second storage nodes 140*b* may be disposed on the buried contacts 126 with the landing pads 130*b* interposed therebetween.

FIGS. 16A to 18D illustrate another embodiment of a method of manufacturing a memory device in accordance with the inventive concept. Reference will also be made to the memory device 100*b*, illustrated in FIGS. 3A to 3D, as an example of the device that can be made by the method.

Referring to FIGS. 16A to 16D, the method of manufacturing the memory device 100*b* may include forming trenches T in substrate 102, forming trench liners 104 and device isolation layers 106 in the trenches T to form a trench isolation structure, forming gate trenches GT in the resulting structure including in the trench isolation structure, and forming gate line stacks 108 in the gate trenches GT.

The substrate 102 may span a cell area CA and a peripheral area PA of the device. The cell area CA may include active areas AA and device isolation area DI. The trenches T, the trench liners 104 which line the trenches T, and the device isolation layers 106 which fill the trenches T, may be formed in the device isolation area DI.

Each gate line stack 108 may include a gate insulating layer 108*a*, a gate barrier layer 108*b*, a gate line 108*c*, and a gate capping layer 108*d*, which are sequentially formed in the gate trench GT. The gate line stack 108 may fill a gate trench GT.

A first interlayer insulating layer 114 may be formed on the active areas AA and the device isolation layer 106, and bit line contact plugs 116 may be formed through the first interlayer insulating layer 114. Bit line stacks 118, which cross the gate line stacks 108, may be formed on the active areas AA and the device isolation layer 106. A sidewall spacer layer 120 may be formed to surround the bit line stacks 118. A second interlayer insulating layer 122 may be formed over the bit line stacks 118, and buried contact holes 124 may be formed through the interlayer insulating layer 122 to expose the active areas AA. Buried contacts 126 may be formed to fill the buried contact holes 124. The buried contacts 126 may be arranged in a matrix. The buried contacts 126 may comprise a metal silicide, a metal, or polysilicon doped with impurities.

The above-described elements and features may be formed by well known processes that are conventional per se, such as photolithography, etching, deposition, planarization, and ion implantation processes and will not be described here in detail. That is, those of ordinary skill in the art will readily appreciate the processes by which the structure shown in FIGS. 16A-16D can be formed.

Referring to FIGS. 17A to 17D, and 1A, the method of manufacturing the memory device 100b may include forming the expanded landing pads 130a in the first separation area SA1 between the gate line stacks 108 of the cell area CA in one direction, and forming the bit lines 130c in the peripheral area PA.

Expanded landing pad barriers 128a may be formed before the expanded landing pads 130a so as to lie under the expanded landing pads 128a. The expanded landing pads 130a and the expanded landing pad barriers 128a each may be electrically connected to a buried contact 126, and include an expanded portion EP extending over one side of the bit line stack 118 adjacent the buried contact 126. Each row of expanded landing pads 130a may be disposed in a first separation area SA1 between adjacent rows of the gate line stacks 108. Surfaces of the buried contacts 126, which are arranged in a row, may be exposed in a second separation area SA2 of the gate line stacks 108. The bit lines 130c and the bit line barriers 128c, which are disposed thereunder, may be formed in the peripheral area PA.

Referring to FIGS. 18A to 18D, the method of manufacturing the memory device 100b may include forming a third interlayer insulating layer 136, which covers the second interlayer insulating layer 122 and the expand landing pads 130a. First storage contact holes 138a and second storage contact holes 138b may be formed through the third interlayer insulating layer 136. The expanded portion EP of each landing pad 130a, which lies over a bit line stack 118 and is electrically connected to one buried contact 126, may be exposed through the first storage contact hole 138a. The upper surface of another buried contact 126 may be exposed through the second storage contact hole 138b. The third interlayer insulating layer 136 may comprise silicon oxide ($SiO_2$).

Then, and referring to FIGS. 3A to 3D, the method of manufacturing the memory device 100b may subsequently include forming first storage nodes 140a and second storage nodes 140b, which fill the first storage contact holes 138a and the second storage contact holes 138b, respectively.

The first storage nodes 140a may be physically and electrically connected to the expanded landing pads 130a at the expanded portions EP thereof, so as to be electrically connected to respective ones of the buried contacts 126 via the expanded landing pads 130a. The second storage nodes 140b may be directly physically and electrically connected to others of the buried contacts 126.

Thus, centers of the first storage nodes 140 may be horizontally offset from centers of the expanded landing pads 130a. The second storage nodes 140b may be disposed on centers of the buried contacts 126. Heights of the second storage nodes 140b may be greater than those of the first storage nodes 140a.

FIG. 19 is a conceptual view illustrating an embodiment of a module which includes a memory device in accordance with the inventive concept. Referring to FIG. 19, the module 500 may include memory chips 520 mounted on a module substrate 510. The memory chips 520 may comprise a memory device 100a or 100b according to the inventive concept. Input/output terminals 530 may be disposed on at least one side of the module substrate 510.

FIG. 20 is a conceptual block diagram illustrating an embodiment of an electronic system which includes a memory device in accordance with the inventive concept.

Referring to FIG. 20, the electronic system 600 may include a body 610, a microprocessor unit 620, a power supply 630, a function unit 640, and/or a display controller unit 650. The body 610 may be a system board or a motherboard comprising a printed circuit board (PCB). The microprocessor unit 620, the power supply 630, the function unit 640, and the display controller unit 650 may be mounted or installed on the body 610. A display unit 660 may be disposed on an upper surface of the body 610 or an outside of the body 610. For example, the display unit 660 may be disposed on a surface of the body 610, and display an image processed by the display controller unit 650. The power supply 630 may receive a predetermined voltage from an external power source, and distribute the predetermined voltage into various voltage levels, and then supply the voltages to the microprocessor unit 620, the function unit 640, and the display controller unit 650. The microprocessor unit 620 may receive the voltage from the power supply 630, and control the function unit 640 and the display unit 660. The function unit 640 may perform functions of various electronic systems 600. For example, when the electronic system 600 is a mobile electronic device such as a cellular phone, the function unit 640 may be operative to perform dialing or various wireless operations with an external apparatus 670, image output to the display unit 660, and/or sound output to a speaker, and may comprise an image processor when the phone includes a camera. In another example of this embodiment, the function unit 640 may comprise a memory card controller when the electronic system 600 is configured to receive a memory card for expanding storage capacity. The function unit 640 may transmit or receive a signal to or from the external apparatus 670 through a wired or wireless communication unit 680. Also, when the electronic system 600 requires a Universal Serial Bus (USB), and/or the like, which is capable of expanding functionality, the function unit 640 may perform as an interface controller. The function unit 640A may comprise a semiconductor device 100a or 100b according to the inventive concept may be included in.

Figure 21:
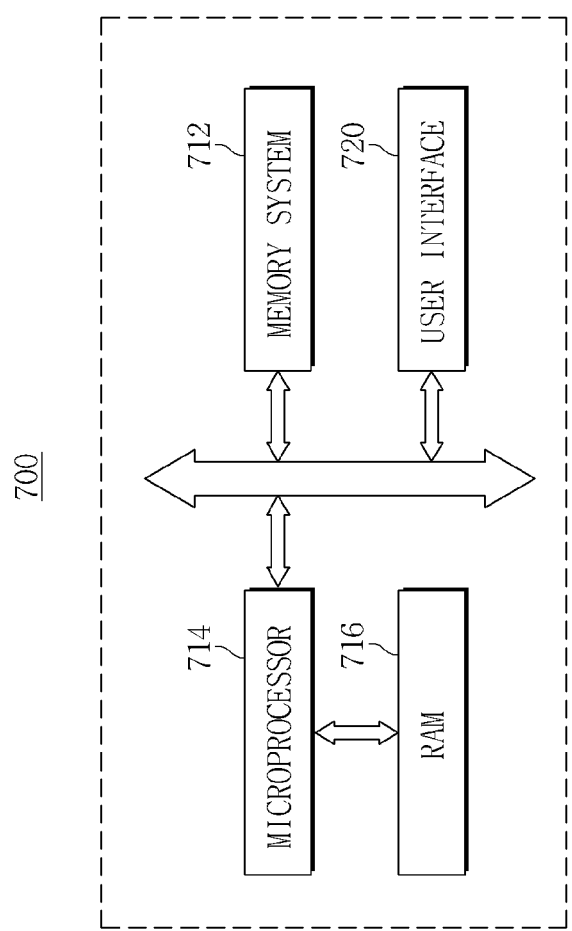
FIG. 21 is a schematic block diagram illustrating an electronic system in accordance with an embodiment of the inventive concept, which includes the memory device in accordance with the embodiment of the inventive concept.

FIG. 21 is a schematic block diagram illustrating an embodiment of an electronic system which includes a memory device in accordance with the inventive concept.

Referring to FIG. 21, the electronic system 700 may be employed by a mobile electronic apparatus or a computer. For example, the electronic system 700 may include a memory system 712, a microprocessor 714, a RAM 716, and a user interface 720 which performs data communication using a bus. The microprocessor 714 may program or control the electronic system 700. The RAM 716 may be used as an operational memory of the microprocessor 714. For example, the microprocessor 714 or the RAM 716 may comprise a memory device 100a or 100b according to the inventive concept. The microprocessor 714, the RAM 716 and/or other devices may be integrated in a single package. The user interface 718 may be used in data input to the electronic system 700 or data output from the electronic system 700. The memory system 712 may store codes, which are used to operate the microprocessor 714, data processed by the microprocessor 714, or external input data. The memory system 712 may include a controller and a memory.

As described above, a memory device according to the inventive concept includes first landing pads having expanded portions extending over the bit lines, thereby ensuring a process margin.

Also the arrangement and form of landing pads in the cell area may be similar to the layout and form of bit lines in the peripheral area. For example, the expanded portions of the landing pads may be considered as extending at right angles to columns of the landing pads, and the bit lines may extend lengthwise in the direction of the columns and have relatively wide portions including extensions at right angles to the direction of the columns. Thus, the same illumination system can be used to form the landing pads and the bit lines. Thus, manufacturing processes may be minimized.

While the inventive concept has been described with reference to exemplary embodiments, it will be understood by those skilled in the art that various changes and modifications may be made without departing from the spirit and scope of the present invention as defined by the appended claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory device comprising:
a substrate spanning a cell area and a peripheral area of the device;
gate line stacks and bit line stacks, the bit line stacks crossing the gate line stacks in the cell area;
first and second groups of buried contacts, each of the buried contacts being disposed in a respective area bounded by neighboring ones of the gate line stacks and neighboring ones of the bit line stacks in a plan view of the device;
rows of expanded first landing pads, the expanded first landing pads including expanded portions respectively electrically connected to the buried contacts of the first group and extending over respective ones of the bit line stacks that are adjacent to the buried contacts of the first group;
second landing pads spaced disposed in columns with the expanded first landing pads as spaced apart from the expanded first landing pads, respectively electrically connected to the buried contacts of the second group, and having widths smaller than those of the expanded first landing pads in a given horizontal direction parallel to an upper surface of the substrate; and
first storage nodes electrically connected to the expanded first landing pads at the expanded portions thereof, and second storage nodes electrically connected to the second landing pads.

2. The memory device of claim 1, further comprising bit lines disposed in the peripheral area, and wherein the bit lines in the peripheral area, the expanded first landing pads and the second landing pads are all disposed directly on the same layer of material in the device.

3. The memory device of claim 1, wherein in the plan view the center of each of the expanded first landing pads is laterally offset from the center of a respective one of the first storage nodes.

4. The memory device of claim 1, wherein in the plan view the center of each of the expanded first landing pads is laterally offset from the center of the buried contact of the first group to which it is electrically connected.

5. The memory device of claim 1, wherein each the second storage nodes is disposed over the center the buried contact of the second group to which it is electrically connected.

6. The memory device of claim 1, wherein the second landing pads are disposed in a row.

7. The memory device of claim 1, wherein the buried contacts are disposed in rows and columns.

8. The memory device of claim 1, wherein the second storage nodes have the same height, the first storage nodes have the same height, and the height of the second storage nodes is greater than that of the first storage nodes.

9. The memory device of claim 1, wherein the first storage nodes are disposed in rows and the second storage nodes are disposed in a row between adjacent rows of the first storage nodes, and the second storage nodes are offset in the direction of the rows from the first storage nodes.

10. The memory device of claim 1, wherein upper surfaces of the expanded first landing pads is disposed at a level above those of the second landing pads.

11. The memory device of claim 1, wherein the cell area includes an active area and a device isolation area, and the gate line stacks are buried in the substrate across the active area and the device isolation area.

12. The memory device of claim 1, further comprising an expanded landing pad barrier interposed between the buried contacts of the first group and the expanded first landing pads, and a landing pad barrier interposed between the buried contacts of the second group and the second landing pads.

13. A memory device comprising:
a substrate;
gate line stacks and bit line stacks, the bit line stacks crossing the gate line stacks;
first and second groups of buried contacts, each of the buried contacts being disposed in a respective area bounded by neighboring ones of the gate line stacks and neighboring ones of the bit line stacks in a plan view of the device;
expanded landing pads disposed in rows and columns, respectively electrically connected to the buried contacts of the first group, and including expanded portions extending over respective ones of the bit line stacks adjacent the buried contacts of the first group; and
first storage nodes electrically connected to the expanded landing pads at the expanded portions thereof, and second storage nodes electrically connected to the buried contacts of the second group.

14. The memory device of claim 13, wherein the substrate has active areas and a device isolation area, and first ones of the gate line stacks are buried in the active area and second ones of gate lines stacks are buried in the device isolation area, the first ones of the gate line stacks have the same height, the second ones of the gate lines stacks have the same height, and the height of the first ones of the gate line stacks is different from the height of the second ones of the gate line stacks.

15. The memory device of claim 14, wherein the active areas have source/drain regions, and further comprising a bit plug interposed between one of the bit line stacks and one of the source/drain regions.

16. A memory device having a cell area and comprising:
a substrate spanning the cell area of the device;
gate line stacks and bit line stacks, the bit line stacks crossing the gate line stacks in the cell area;
an interlayer insulating layer disposed on the substrate;

first and second groups of buried contacts, the buried contacts of the first group arrayed in first rows and the buried contacts of the second group arrayed in a second row, the second row of buried contacts being interposed between the first row of buried contacts, and each of the buried contacts being buried in the interlayer insulating layer within a respective area bounded in a plan view of the device by neighboring ones of the gate line stacks and neighboring ones of the bit line stacks;

rows of first conductive pad contacts, the first conductive pad contacts respectively electrically connected to the buried contacts of the first group, each of the first conductive pad contacts having a first portion extending directly over the buried contact to which it is electrically connected, and an extension extending from the first portion on an upper surface of the interlayer insulating layer to a location over a respective one of the bit line stacks that is adjacent to said buried contact; and first storage nodes electrically connected to the first conductive pad contacts at the extensions thereof so as to be respectively electrically connected to the buried contacts of the first group via the first conductive pad contacts, and second storage nodes respectively electrically connected to the buried contacts of the second group.

17. The memory device of claim 16, wherein the substrate has active portions and a device isolation structure electrically isolating the active portions from one another in the cell area, the active portions of the substrate each include source/drain regions, and the buried contacts are electrically connected to the source/drain regions.

18. The memory device of claim 16, further comprising a row of second conductive pad contacts interposed between the rows of the first conductive pad contacts, and wherein the second conductive pad contacts each have a footprint smaller than that of each of the first conductive pad contacts, and the second conductive pad contacts are respectively electrically connected to the buried contacts of the second group.

19. The memory device of claim 18, wherein the buried contacts have upper surfaces disposed beneath the level of the upper surface of the interlayer insulating layer, the first portions of the first conductive pad contacts extend into the interlayer insulating layer as vertically aligned with buried contacts of the first group, respectively, and the second conductive pad contacts are disposed within the interlayer insulating layer as vertically aligned with the buried contacts of the second group, respectively.

20. The memory device of claim 16, wherein the upper surfaces of the buried contacts are coplanar with the upper surface of the interlayer insulating layer, and the second storage nodes contact the buried contacts of the second group, respectively.

* * * * *